(12) United States Patent
Ohashi et al.

(10) Patent No.: US 12,550,398 B2
(45) Date of Patent: *Feb. 10, 2026

(54) SEMICONDUCTOR DEVICE, INVERTER CIRCUIT, DRIVING DEVICE, VEHICLE, AND ELEVATOR

(71) Applicant: KABUSHIKI KAISHA TOSHIBA, Tokyo (JP)

(72) Inventors: Teruyuki Ohashi, Kawasaki Kanagawa (JP); Hiroshi Kono, Himeji Hyogo (JP); Shunsuke Asaba, Himeji Hyogo (JP); Takahiro Ogata, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 383 days.

This patent is subject to a terminal disclaimer.

(21) Appl. No.: 18/177,888

(22) Filed: Mar. 3, 2023

(65) Prior Publication Data

US 2024/0079453 A1 Mar. 7, 2024

(30) Foreign Application Priority Data

Sep. 1, 2022 (JP) .................................. 2022-139054

(51) Int. Cl.
*H10D 62/832* (2025.01)
*H10D 8/60* (2025.01)
(Continued)

(52) U.S. Cl.
CPC .......... *H10D 62/8325* (2025.01); *H10D 8/60* (2025.01); *H10D 62/106* (2025.01); *H10D 84/146* (2025.01)

(58) Field of Classification Search
CPC .... H10D 62/8325; H10D 8/60; H10D 62/106; H10D 84/146; H10D 62/157
See application file for complete search history.

(56) References Cited

U.S. PATENT DOCUMENTS

| 10,756,181 B1 | 8/2020 | Kawakami et al. |
| 2007/0221953 A1* | 9/2007 | Sakamoto ............ H10D 84/141 257/E29.081 |

(Continued)

FOREIGN PATENT DOCUMENTS

| JP | 2006156479 A | 6/2006 |
| JP | 2016058498 A | 4/2016 |

(Continued)

OTHER PUBLICATIONS

Not yet published, Japanese Patent Application No. 2021-190279, filed on Nov. 24, 2021.

(Continued)

*Primary Examiner* — Teresa M. Arroyo
(74) *Attorney, Agent, or Firm* — Maier & Maier, PLLC

(57) ABSTRACT

A semiconductor device according to an embodiment includes a semiconductor chip having a transistor region and a diode region, a first conductor, and a second conductor. The semiconductor chip includes a first electrode, a second electrode, a silicon carbide layer between the first electrode and the second electrode, and a gate electrode. The transistor region is provided with a third electrode spaced apart from the first electrode and close to the diode region. One end of the first conductor is in contact with the first electrode, and one end of the second conductor is in contact with the third electrode.

12 Claims, 25 Drawing Sheets

(51) Int. Cl.
*H10D 62/10* (2025.01)
*H10D 84/00* (2025.01)

(56) References Cited

U.S. PATENT DOCUMENTS

| | | |
|---|---|---|
| 2014/0252378 A1* | 9/2014 | Ota .................. H10D 62/53 |
| | | 257/77 |
| 2017/0236935 A1 | 8/2017 | Ebihara et al. |
| 2019/0004096 A1 | 1/2019 | Nagao |
| 2021/0288158 A1* | 9/2021 | Shimizu .............. H10D 30/66 |
| 2022/0013639 A1 | 1/2022 | Tanaka et al. |
| 2023/0163166 A1 | 5/2023 | Ohashi et al. |
| 2023/0266291 A1* | 8/2023 | Myrick .............. G01N 31/223 |
| 2024/0079453 A1* | 3/2024 | Ohashi .............. H10D 62/106 |

FOREIGN PATENT DOCUMENTS

| | | |
|---|---|---|
| JP | 2020150159 A | 9/2020 |
| JP | 7004117 B1 | 1/2022 |
| JP | 2022016286 A | 1/2022 |
| JP | 2023077119 A | 6/2023 |
| WO | 2016052261 A1 | 4/2016 |
| WO | 2017104516 A1 | 6/2017 |

OTHER PUBLICATIONS

U.S. Appl. No. 17/822,949, projected publication date on May 25, 2023.
Office Action issued on Nov. 11, 2025, in corresponding Japanese Application No. 2022-139054, 19 pages.

* cited by examiner

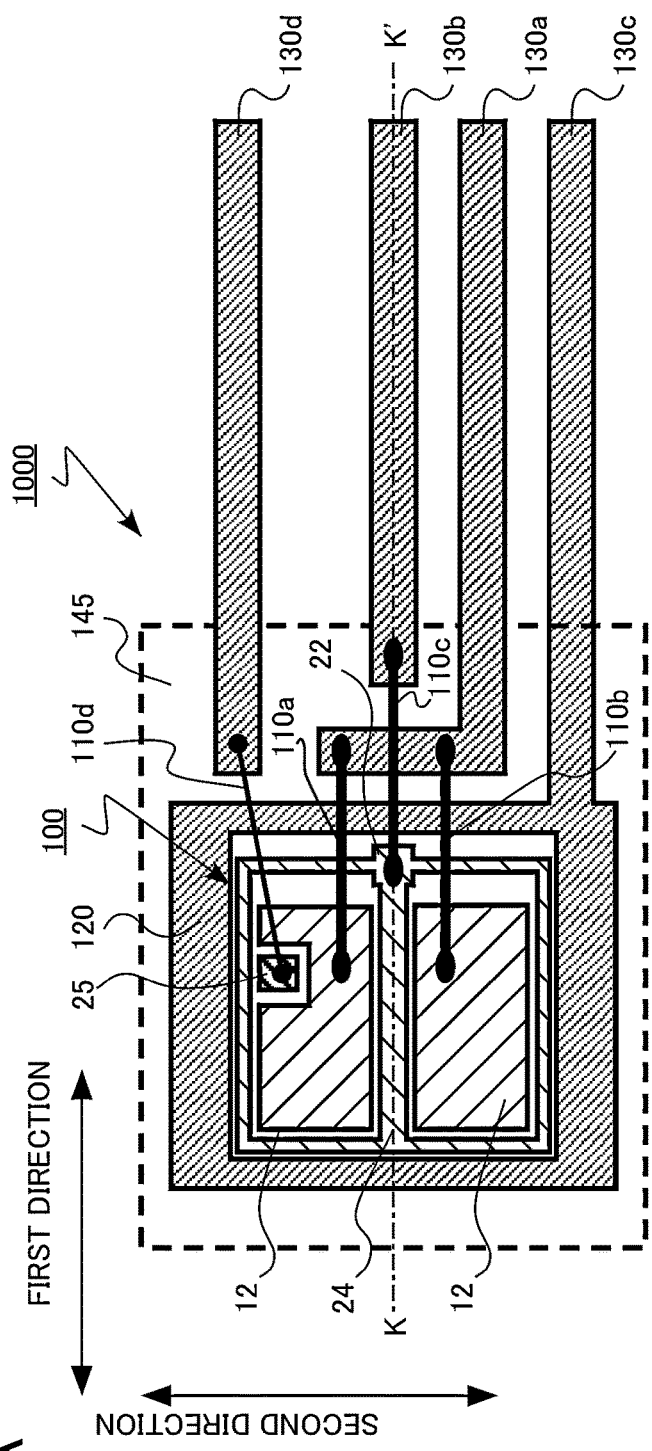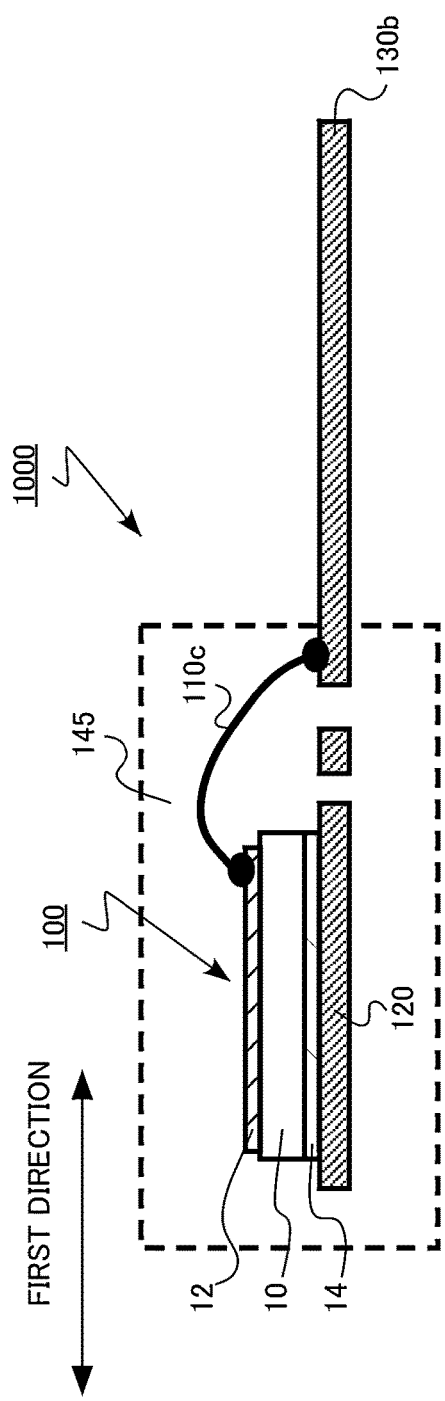

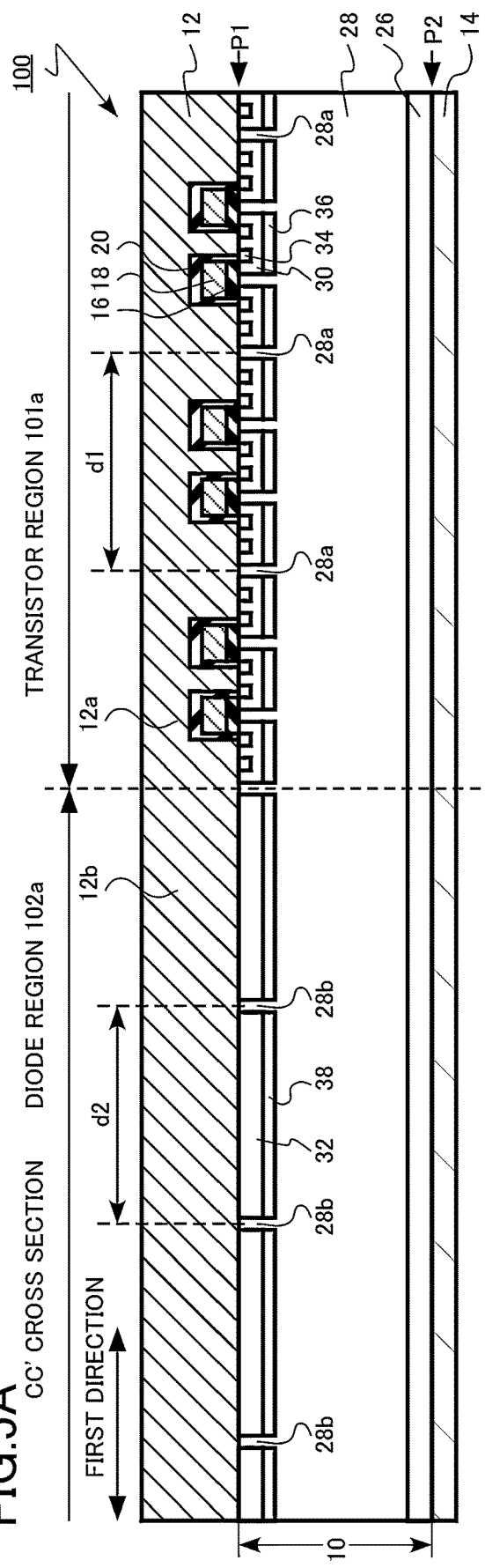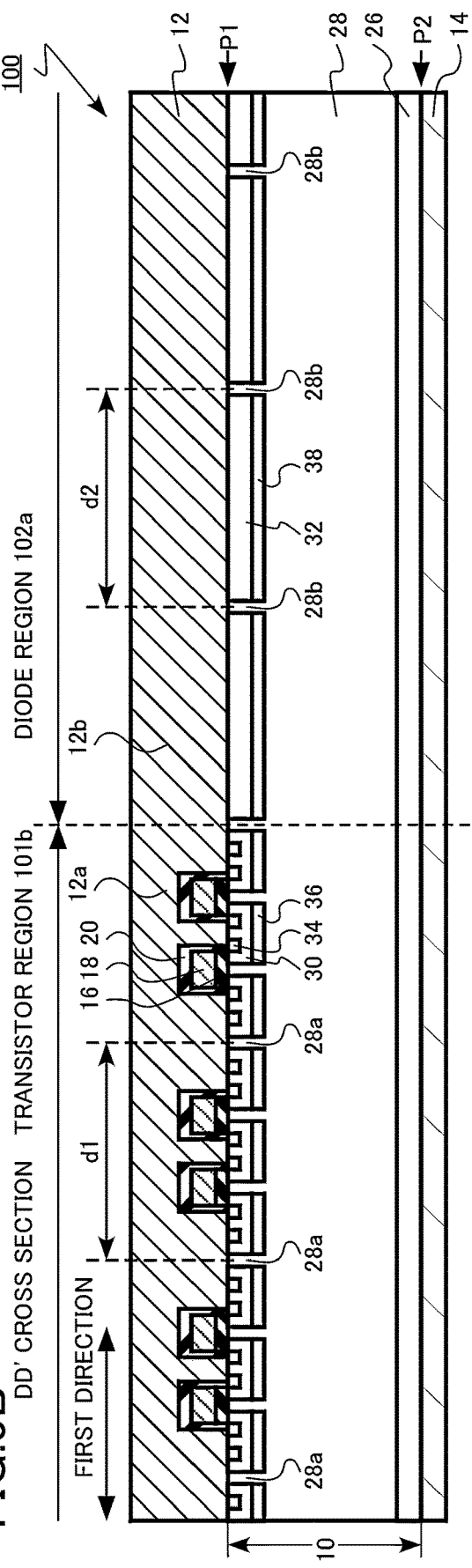

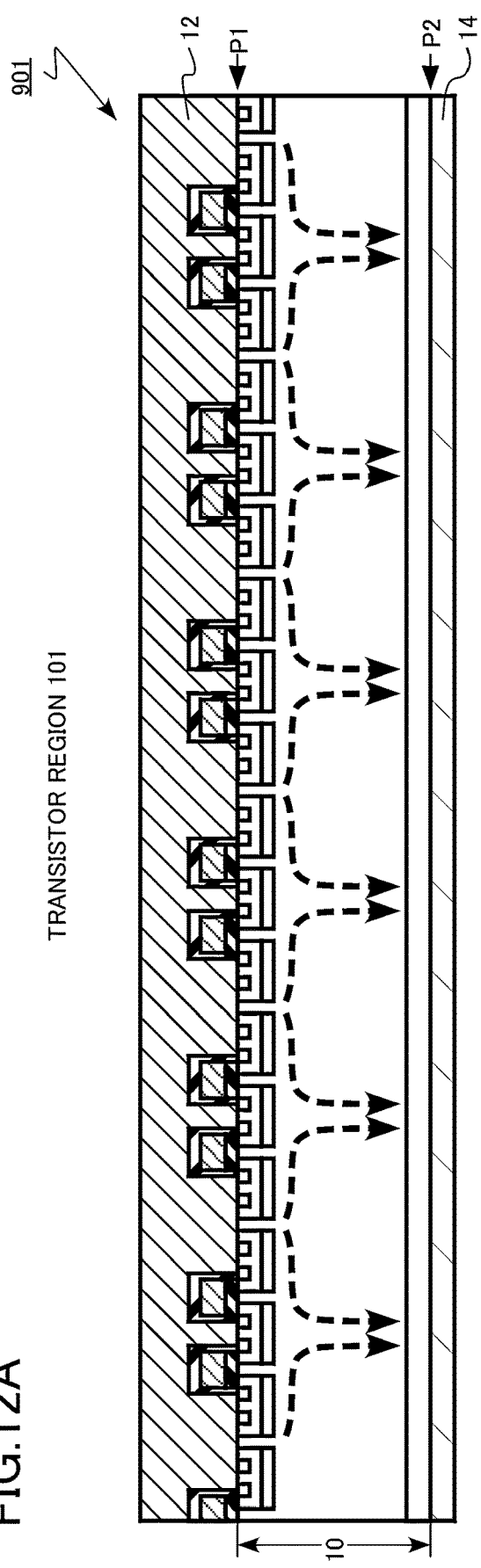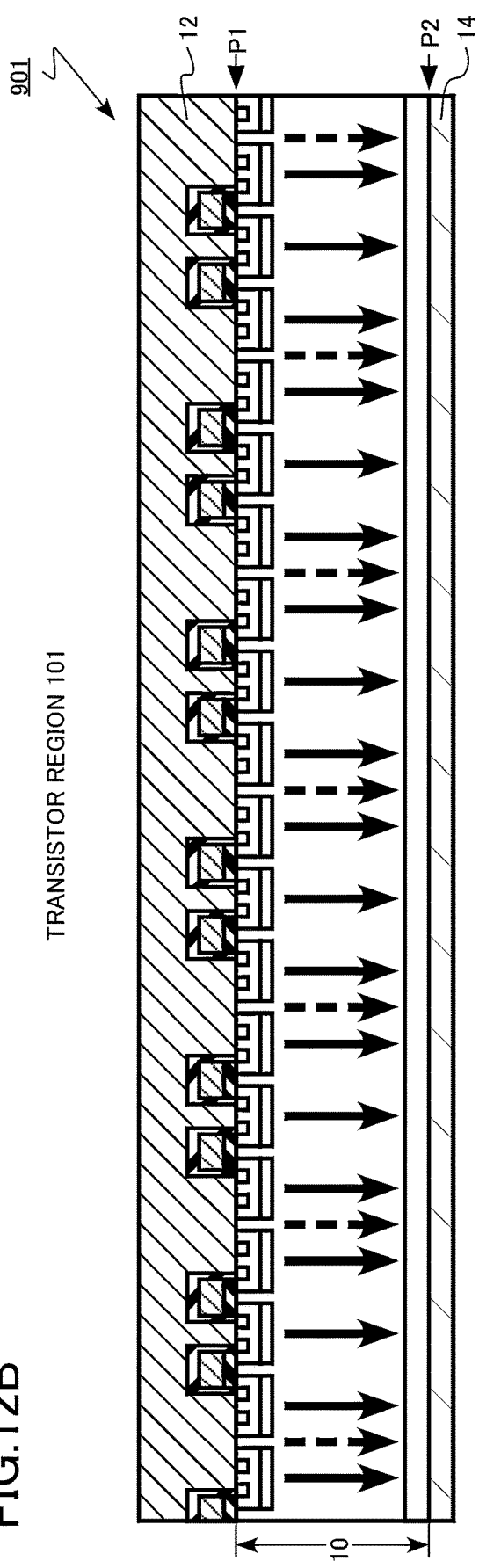

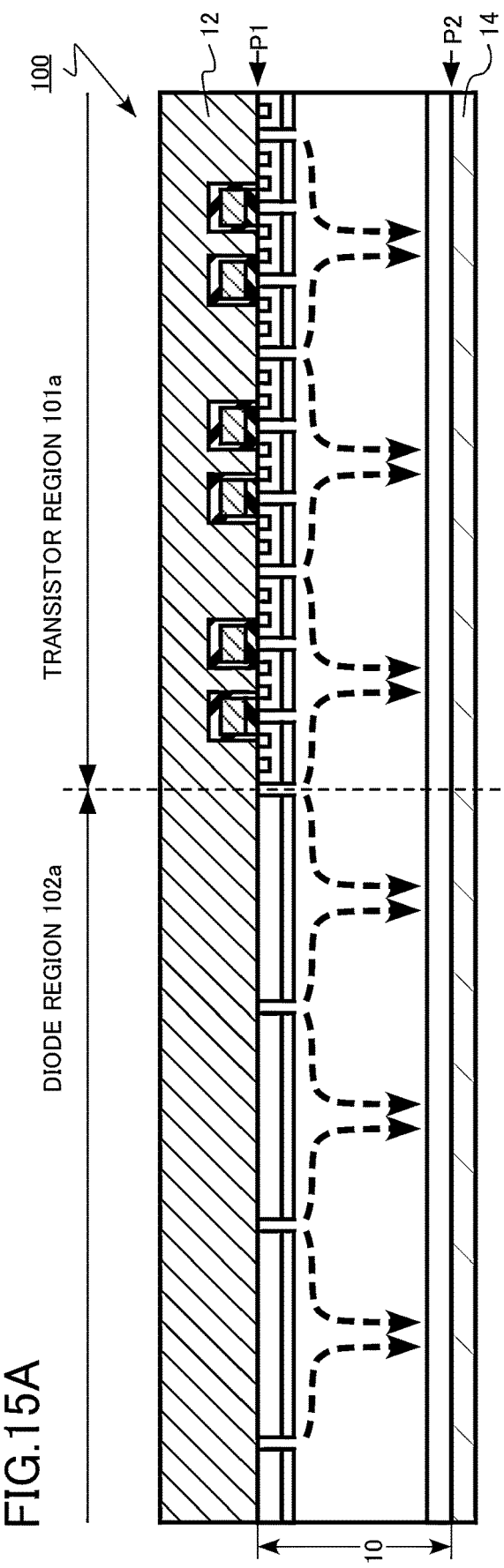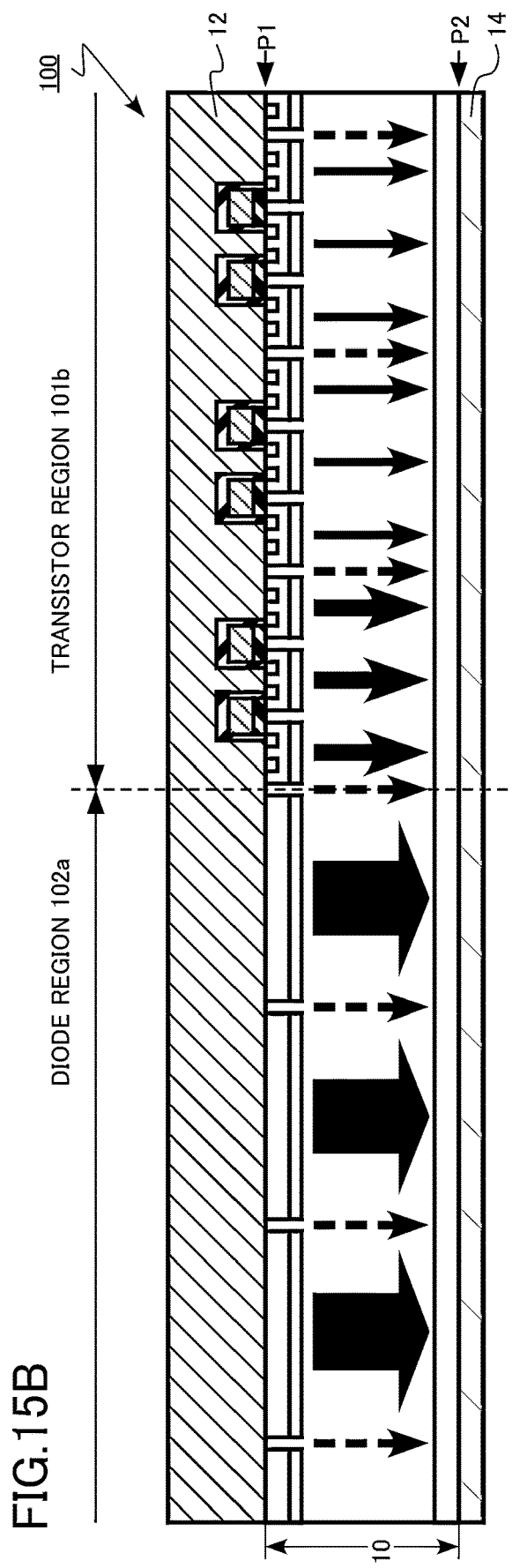

SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2022-139054, filed on Sep. 1, 2022, the entire contents of which are incorporated herein by reference.

FIELD

Embodiments described herein relate generally to a semiconductor device, an inverter circuit, a driving device, a vehicle, and an elevator.

BACKGROUND

Silicon carbide is expected as a material for a next-generation semiconductor device. As compared with silicon, silicon carbide has excellent physical properties such as a band gap of three times, a breakdown field strength of about ten times, and a thermal conductivity of about three times. By utilizing this characteristic, for example, a metal oxide semiconductor field effect transistor (MOSFET) capable of operating at a high breakdown voltage, a low loss, and a high temperature can be realized.

A vertical MOSFET using silicon carbide includes a pn junction diode as a built-in diode. For example, the MOSFET is used as a switching element connected to an inductive load. In this case, even when the MOSFET is turned off, it is possible to allow a reflux current to flow using the built-in diode.

However, when a reflux current is caused to flow using a body diode, there is a problem in that a stacking fault grows in a silicon carbide layer due to recombination energy of carriers, and on-resistance of the MOSFET increases. An increase in on-resistance of the MOSFET causes a decrease in reliability of the MOSFET. For example, by providing a Schottky Barrier Diode (SBD) that performs unipolar operation as a built-in diode in the MOSFET, it is possible to suppress growth of the stacking fault in the silicon carbide layer. The reliability of the MOSFET is improved by providing the SBD as a built-in diode in the MOSFET.

A large surge current may flow into the MOSFET instantaneously beyond the steady state. When a large surge current flows, a large surge voltage is applied to generate heat, and the MOSFET is broken. The maximum allowable peak current value ($I_{FSM}$) of the surge current allowed in the MOSFET is referred to as a surge current tolerance. In the MOSFET having the SBD provided therein, it is desired to improve a surge current tolerance.

BRIEF DESCRIPTION OF THE DRAWINGS

FIGS. 1A and 1B are schematic diagrams of a semiconductor device according to a first embodiment;

FIGS. 5A and 5B are schematic cross-sectional views of the semiconductor device according to the first embodiment;

FIGS. 12A and 12B are explanatory diagrams of a function and an effect of the semiconductor device according to the first embodiment;

FIGS. 15A and 15B are explanatory diagrams of the function and the effect of the semiconductor device according to the first embodiment;

DETAILED DESCRIPTION

Figure 2B:
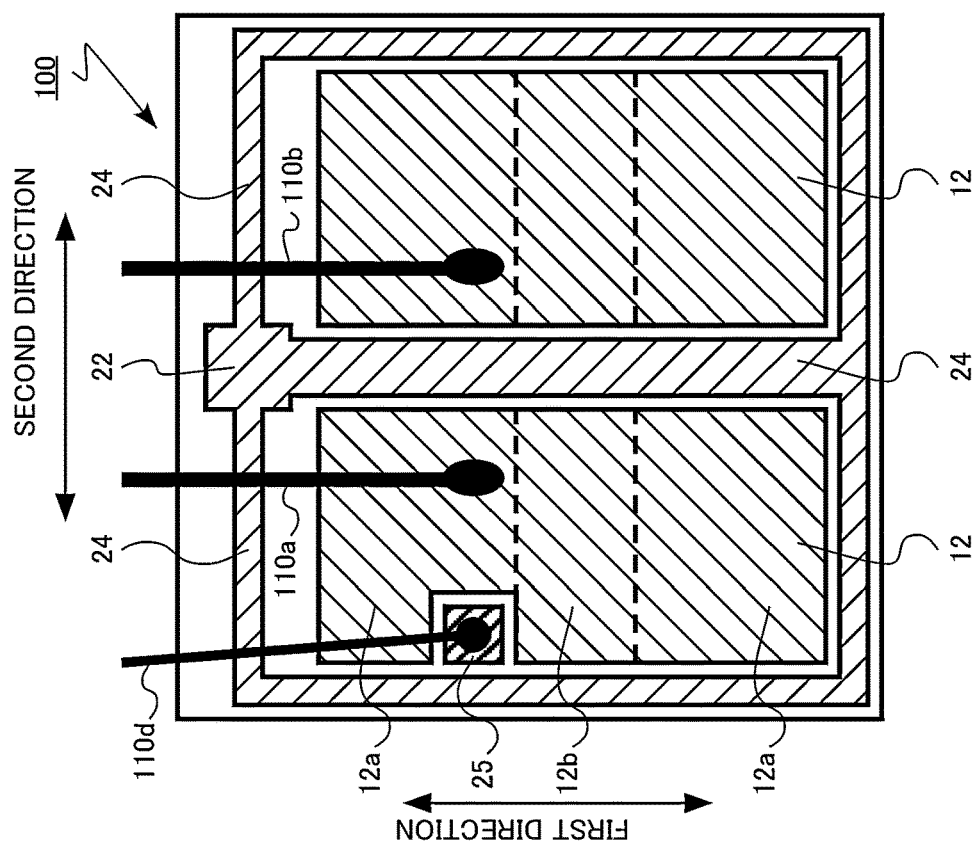
FIGS. 2A and 2B are schematic top views of the semiconductor device according to the first embodiment.

A semiconductor device according to an embodiment includes: a semiconductor chip including a plurality of transistor regions and at least one diode region, wherein the transistor regions include a silicon carbide layer having a first plane and a second plane facing the first plane, the silicon carbide layer including a first silicon carbide region of n-type having a plurality of first portions in contact with the first plane, a second silicon carbide region of p-type provided between the first silicon carbide region and the first plane, and a third silicon carbide region of n-type provided between the second silicon carbide region and the first plane, a first electrode in contact with the first portions, the second silicon carbide region, and the third silicon carbide region, a second electrode in contact with the second plane, a gate electrode facing the second silicon carbide region, and a gate insulating layer provided between the gate electrode and the second silicon carbide region, wherein the at least one diode region includes the silicon carbide layer including the first silicon carbide region of n-type having a plurality of second portions in contact with the first plane and a fourth silicon carbide region of p-type provided between the first silicon carbide region and the first plane, the first electrode in contact with the second portions and the fourth silicon carbide region, and the second electrode, wherein an occupied area per unit area of the fourth silicon carbide region projected onto the first plane is larger than an occupied area per the unit area of the second silicon carbide region projected onto the first plane, wherein a first diode region, which is one of the at least one diode region, is provided between a first transistor region, which is one of the transistor regions, and a second transistor region, which is one of the transistor regions provided in a first direction with respect to the first transistor region, and wherein the first transistor region includes a third electrode provided on a side of the first plane of the silicon carbide layer and separated from the first electrode; a first conductor having one end in contact with the first electrode and applying a voltage to the first electrode; and a second conductor having one end in contact with the third electrode and applying a voltage to the third electrode.

Hereinafter, embodiments of the present disclosure will be described with reference to the drawings. In the following description, the same or similar members and the like are denoted by the same reference numerals, and the description of the members and the like once described may be appropriately omitted.

In the following description, when notations of $n^+$, n, and $n^-$ and $p^+$, p, and $p^-$ are used, the above notations represent relative levels of impurity concentration in each conductive type. That is, $n^+$ indicates that the n-type impurity concentration is relatively higher than n, and $n^-$ indicates that the n-type impurity concentration is relatively lower than n. In addition, $p^+$ indicates that the p-type impurity concentration is relatively higher than p, and $p^-$ indicates that the p-type impurity concentration is relatively lower than p. In addition, an $n^+$ type and an $n^-$ type may be simply referred to as an n type, and a $p^+$ type and a $p^-$ type may be simply referred to as a p type.

The impurity concentration can be measured by, for example, secondary ion mass spectrometry (SIMS). Further, the relative level of the impurity concentration can also be determined from the level of carrier concentration obtained by, for example, scanning capacitance microscopy (SCM). In addition, distances such as a depth and a thickness of an impurity region can be obtained by, for example, SIMS. Furthermore, distances such as a depth, a thickness, a width, and an interval of the impurity region can be obtained from, for example, a composite image of an SCM image and an atomic force microscope (AFM) image.

In the present specification, impurity concentration of a semiconductor region means the maximum impurity concentration of the semiconductor region unless otherwise stated.

First Embodiment

A semiconductor device according to a first embodiment includes: a semiconductor chip including a plurality of transistor regions and at least one diode region, wherein the transistor regions include a silicon carbide layer having a first plane and a second plane facing the first plane, the silicon carbide layer including a first silicon carbide region of n-type having a plurality of first portions in contact with the first plane, a second silicon carbide region of p-type provided between the first silicon carbide region and the first plane, and a third silicon carbide region of n-type provided between the second silicon carbide region and the first plane, a first electrode in contact with the first portions, the second silicon carbide region, and the third silicon carbide region, a second electrode in contact with the second plane, a gate electrode facing the second silicon carbide region, and a gate insulating layer provided between the gate electrode and the second silicon carbide region, wherein the at least one diode region includes the silicon carbide layer including the first silicon carbide region of n-type having a plurality of second portions in contact with the first plane and a fourth silicon carbide region of p-type provided between the first silicon carbide region and the first plane, the first electrode in contact with the second portions and the fourth silicon carbide region, and the second electrode, wherein an occupied area per unit area of the fourth silicon carbide region projected onto the first plane is larger than an occupied area per unit area of the second silicon carbide region projected onto the first plane, wherein a first diode region, which is one of the at least one diode region, is provided between a first transistor region, which is one of the transistor regions, and a second transistor region, which is one of the transistor regions provided in a first direction with respect to the first transistor region, and wherein the first transistor region includes a third electrode provided on a side of the first plane of the silicon carbide layer and separated from the first electrode; a first conductor having one end in contact with the first electrode and applying a voltage to the first electrode; and a second conductor having one end in contact with the third electrode and applying a voltage to the third electrode.

The semiconductor device according to the first embodiment is a discrete device 1000. In the case of the discrete device 1000, the discrete device 1000 has one MOSFET 100 mounted thereon with a sealing resin. The MOSFET 100 is an example of a semiconductor chip.

The MOSFET 100 included in the discrete device 1000 is a vertical MOSFET of a planar gate type using silicon carbide. The MOSFET 100 is, for example, a double implantation MOSFET (DIMOSFET) in which a body region and a source region are formed by ion implantation. The MOSFET 100 is a MOSFET including a Schottky barrier diode (SBD) as a built-in diode. The MOSFET 100 is a vertical MOSFET of an n-channel type using electrons as carriers.

FIGS. 1A and 1B are schematic diagrams of the semiconductor device according to the first embodiment. FIG. 1A is a top view of the discrete device 1000. FIG. 1B is a cross-sectional view taken along line K-K' in FIG. 1A.

The discrete device 1000 includes the MOSFET 100, a first bonding wire 110a (first conductor), a second bonding wire 110b, a third bonding wire 110c, a fourth bonding wire 110d (second conductor), a metal bed 120 (first metal layer), a first metal lead 130a (second metal layer), a second metal lead 130b, a third metal lead 130c, a fourth metal lead 130d (third metal layer), and a sealing resin 145.

The MOSFET 100 includes a silicon carbide layer 10, a source electrode 12 (first electrode), a drain electrode 14 (second electrode), a gate electrode pad 22, a gate wiring 24, and a sense electrode pad 25 (third electrode). The MOSFET 100 is disposed on the metal bed 120. The MOSFET 100 is connected to the metal bed 120. The metal bed 120 faces the drain electrode 14 of the MOSFET 100. The metal bed 120 is an example of a first metal layer. The metal bed 120 is in contact with the drain electrode 14. The metal bed 120 is electrically connected to the drain electrode 14.

The metal bed 120 is made of metal. The metal bed 120 is, for example, a copper-based alloy or an iron-nickel alloy.

The first metal lead 130*a* extends in the first direction. The first metal lead 130*a* is an example of a second metal layer.

The first metal lead 130*a* is an electrode terminal. The first metal lead 130*a* has a function of applying a voltage to the semiconductor chip 100 from the outside of the discrete device 1000.

The first metal lead 130*a* is metal. The first metal lead 130*a* is, for example, a copper-based alloy or an iron-nickel alloy.

The second metal lead 130*b* extends in the first direction. The second metal lead 130*b* is an electrode terminal. The second metal lead 130*b* has a function of applying a voltage to the semiconductor chip 100 from the outside of the discrete device 1000.

The second metal lead 130*b* is metal. The second metal lead 130*b* is, for example, a copper-based alloy or an iron-nickel alloy.

The third metal lead 130*c* extends in the first direction. The third metal lead 130*c* is an electrode terminal. The third metal lead 130*c* has a function of applying a voltage to the semiconductor chip 100 from the outside of the discrete device 1000. The third metal lead 130*c* is connected to the metal bed 120.

The third metal lead 130*c* is metal. The third metal lead 130*c* is, for example, a copper-based alloy or an iron-nickel alloy.

The fourth metal lead 130*d* extends in the first direction. The fourth metal lead 130*d* is an example of a third metal layer.

The fourth metal lead 130*d* is an electrode terminal. The fourth metal lead 130*d* has a function of applying a voltage to the semiconductor chip 100 from the outside of the discrete device 1000.

The fourth metal lead 130*d* is metal. The fourth metal lead 130*d* is, for example, a copper-based alloy or an iron-nickel alloy.

The first bonding wire 110*a* has one end connected to the source electrode 12 and the other end connected to the first metal lead 130*a*. The first bonding wire 110*a* is an example of a first conductor.

The first bonding wire 110*a* electrically connects the source electrode 12 to the first metal lead 130*a*. The first bonding wire 110*a* has a function of applying a voltage applied to the first metal lead 130*a* to the source electrode 12.

The first bonding wire 110*a* is metal. The first bonding wire 110*a* is, for example, aluminum, copper, or gold.

The second bonding wire 110*b* has one end connected to the source electrode 12 and the other end connected to the first metal lead 130*a*. The second bonding wire 110*b* electrically connects the source electrode 12 to the first metal lead 130*a*. The second bonding wire 110*b* has a function of applying a voltage applied to the first metal lead 130*a* to the source electrode 12.

The second bonding wire 110*b* is metal. The second bonding wire 110*b* is, for example, aluminum, copper, or gold.

The third bonding wire 110*c* has one end connected to the gate electrode pad 22 and the other end connected to the second metal lead 130*b*. The third bonding wire 110*c* electrically connects the gate electrode pad 22 to the second metal lead 130*b*. The third bonding wire 110*c* has a function of applying a voltage applied to the second metal lead 130*b* to the gate electrode pad 22.

The third bonding wire 110*c* is metal. The third bonding wire 110*c* is, for example, aluminum, copper, or gold.

The fourth bonding wire 110*d* has one end connected to the sense electrode pad 25 and the other end connected to the fourth metal lead 130*d*. The fourth bonding wire 110*d* is an example of a second conductor.

The fourth bonding wire 110*d* electrically connects the sense electrode pad 25 to the fourth metal lead 130*d*. The fourth bonding wire 110*d* has a function of applying a voltage applied to the fourth metal lead 130*d* to the sense electrode pad 25.

The fourth bonding wire 110*d* is metal. The fourth bonding wire 110*d* is, for example, aluminum, copper, or gold.

The sealing resin 145 covers the MOSFET 100, the first bonding wire 110*a*, the second bonding wire 110*b*, the third bonding wire 110*c*, the fourth bonding wire 110*d*, and the metal bed 120. The sealing resin 145 has a function of protecting the MOSFET 100, the first bonding wire 110*a*, the second bonding wire 110*b*, the third bonding wire 110*c*, the fourth bonding wire 110*d*, and the metal bed 120. The sealing resin 145 is, for example, an epoxy resin.

For example, a source voltage is applied to the first metal lead 130*a* from the outside of the MOSFET 100. The first metal lead 130*a* functions as, for example, a source terminal.

For example, a gate voltage is applied to the second metal lead 130*b* from the outside of the MOSFET 100. The second metal lead 130*b* functions as, for example, a gate terminal.

For example, a drain voltage is applied to the third metal lead 130*c* from the outside of the MOSFET 100. The third metal lead 130*c* functions as, for example, a drain terminal.

For example, a source voltage is applied to the fourth metal lead 130*d* from the outside of the MOSFET 100. For example, an ammeter is connected to the fourth metal lead 130*d*. The fourth metal lead 130*d* functions as, for example, a current sense terminal.

Figure 2A:
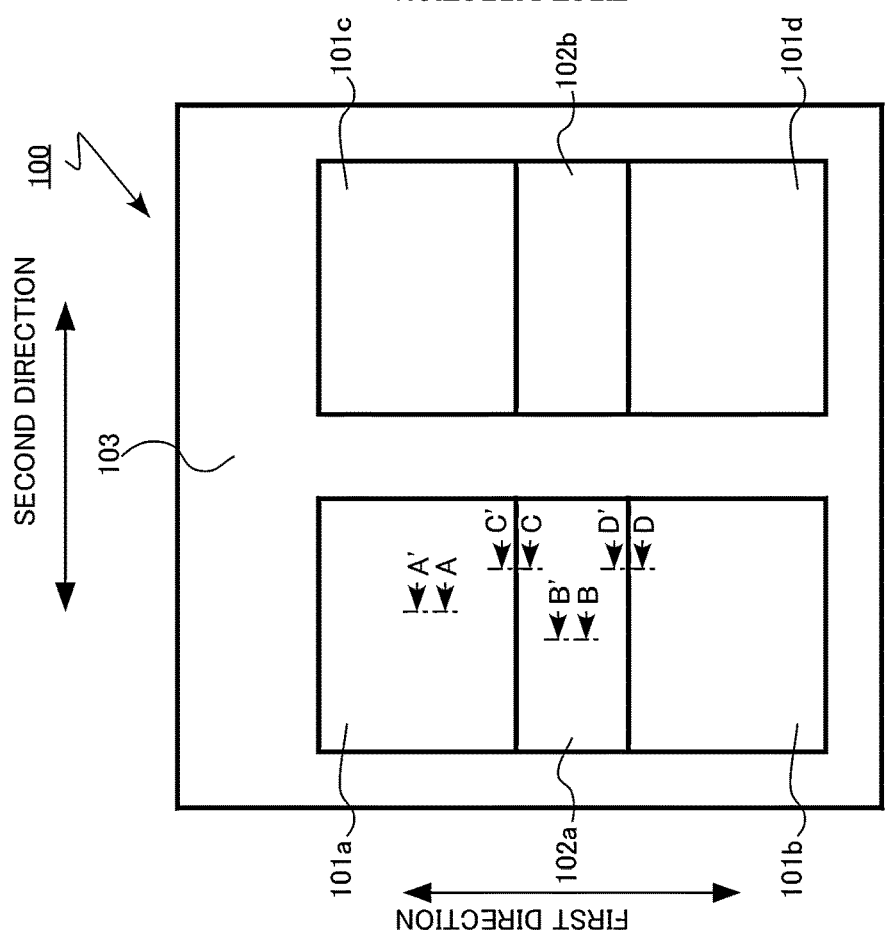

FIGS. 2A and 2B are schematic top views of the semiconductor device according to the first embodiment. FIG. 2A is an arrangement diagram of each region provided in the MOSFET 100. FIG. 2B is a diagram illustrating a pattern of an electrode and a wiring on the upper face of the MOSFET 100.

Figure 3:
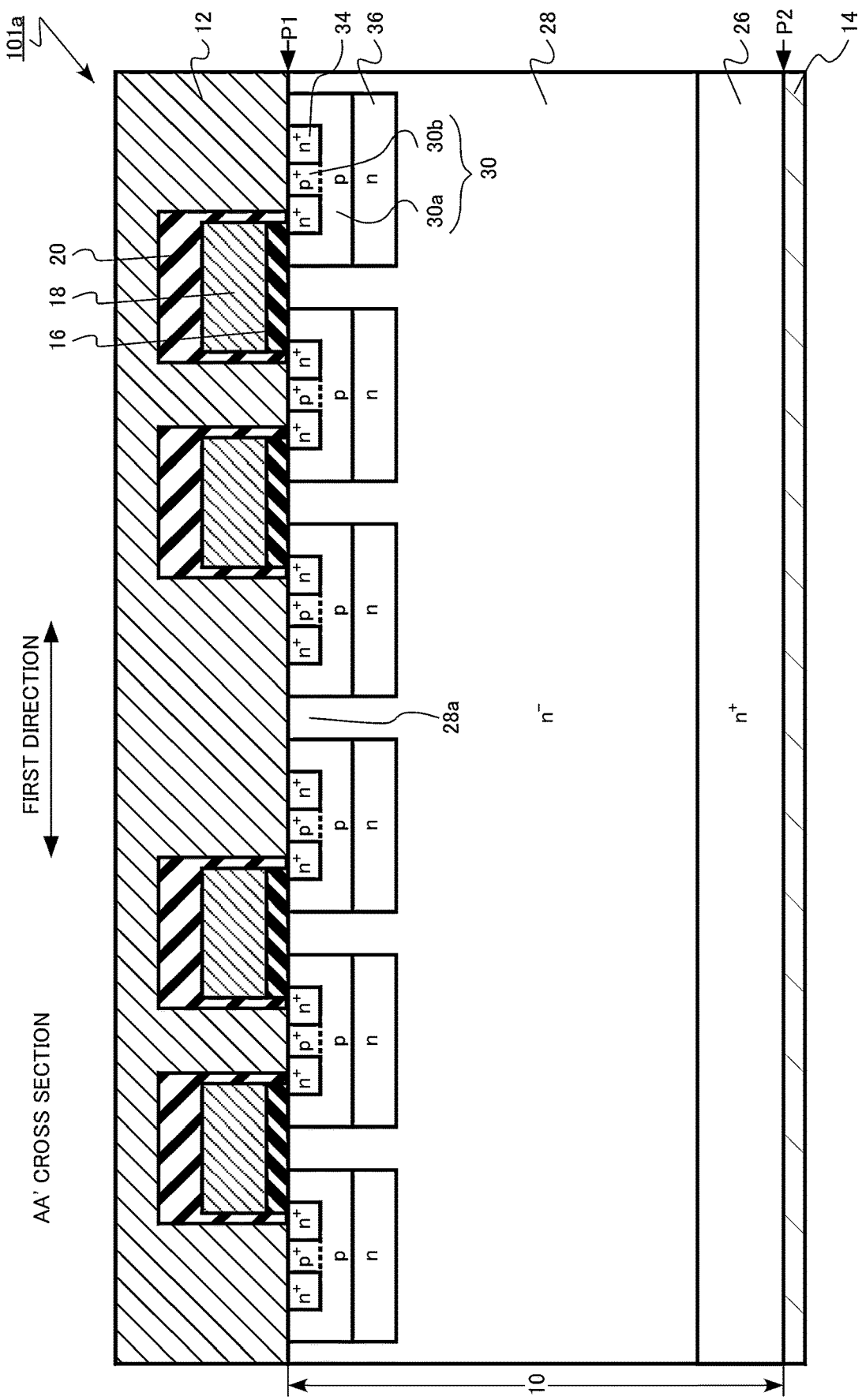
FIG. 3 is a schematic cross-sectional view of the semiconductor device according to the first embodiment.

FIG. 3 is a schematic cross-sectional view of the semiconductor device according to the first embodiment. FIG. 3 is a cross-sectional view taken along line A-A' in FIG. 2A.

Figure 4:
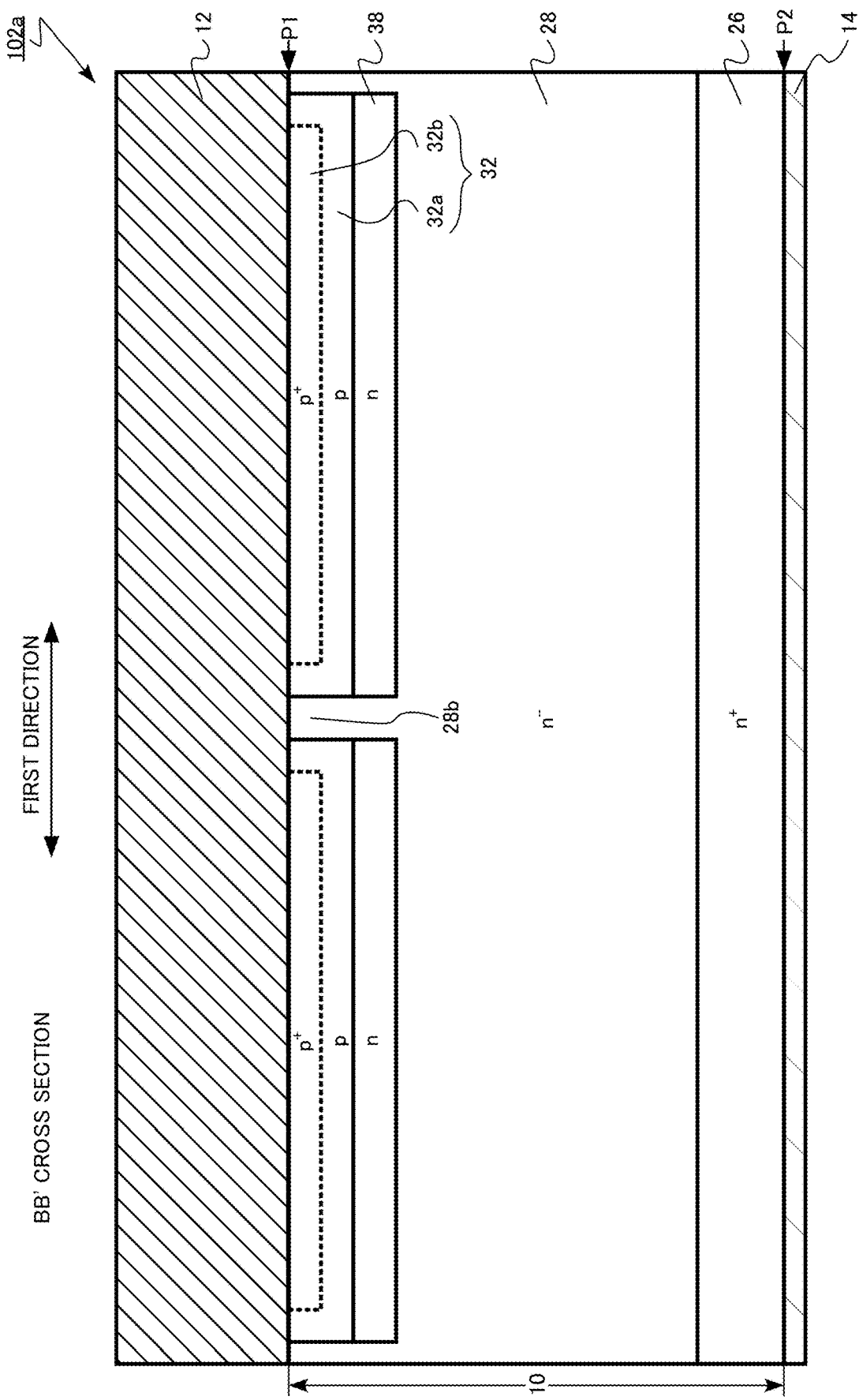
FIG. 4 is a schematic cross-sectional view of the semiconductor device according to the first embodiment.

FIG. 4 is a schematic cross-sectional view of the semiconductor device according to the first embodiment. FIG. 4 is a cross-sectional view taken along line B-B' in FIG. 2A.

FIGS. 5A and 5B are schematic cross-sectional views of the semiconductor device according to the first embodiment. FIG. 5A is a cross-sectional view taken along line C-C' in FIG. 2A. FIG. 5B is a cross-sectional view taken along line D-D' in FIG. 2A.

As illustrated in FIG. 2A, the MOSFET 100 includes a transistor region 101*a* (first transistor region), a transistor region 101*b* (second transistor region), a transistor region 101*c*, a transistor region 101*d*, a diode region 102*a* (first diode region), a diode region 102*b*, and a peripheral region 103. The transistor region 101*a* is an example of a first transistor region. The transistor region 101*b* is an example of a second transistor region. The diode region 102*a* is an example of a first diode region.

Hereinafter, the transistor region 101*a*, the transistor region 101*b*, the transistor region 101*c*, and the transistor region 101*d* may be simply referred to as a transistor region 101 individually or collectively. In addition, the diode region 102*a* and the diode region 102*b* may be simply referred to as a diode region 102 individually or collectively.

The MOSFET and the SBD are provided in the transistor region 101. The SBD is provided in the diode region 102. The MOSFET is not provided in the diode region 102.

The peripheral region 103 surrounds the transistor region 101 and the diode region 102. In the peripheral region 103, a gate electrode pad 22 and a gate wiring 24 are provided.

In the peripheral region 103, for example, a termination structure for improving breakdown voltage of the MOSFET 100 is provided. The termination structure for improving the breakdown voltage of the MOSFET 100 is, for example, a RESURF or a guard ring.

The diode region 102 is provided between the two transistor regions 101. For example, the diode region 102a is provided between the transistor region 101a and the transistor region 101b. The transistor region 101b is provided in the first direction parallel to a first plane P1 with respect to the transistor region 101a.

For example, the diode region 102b is provided between the transistor region 101c and the transistor region 101d. The transistor region 101d is provided in the first direction with respect to the transistor region 101c.

The width of the diode region 102 in the first direction is, for example, 30 μm or more. For example, the width of the diode region 102a in the first direction is 30 μm or more.

The MOSFET 100 includes the silicon carbide layer 10, the source electrode 12 (first electrode), the drain electrode 14 (second electrode), a gate insulating layer 16, a gate electrode 18, an interlayer insulating layer 20, the gate electrode pad 22, the gate wiring 24, and the sense electrode pad 25.

The silicon carbide layer 10 includes a drain region 26 of an n$^+$-type, a drift region 28 of an n$^-$-type (first silicon carbide region), a body region 30 of a p-type (second silicon carbide region), a p region 32 of the p-type (fourth silicon carbide region), a source region 34 of the n$^+$-type (third silicon carbide region), a first bottom region 36 of an n-type, and a second bottom region 38 of the n-type.

The drift region 28 includes a plurality of first portions 28a and a plurality of second portions 28b. The body region 30 includes a low-concentration portion 30a and a high-concentration portion 30b. The p region 32 includes a low-concentration portion 32a and a high-concentration portion 32b.

The silicon carbide layer 10 is provided between the source electrode 12 and the drain electrode 14. The silicon carbide layer 10 is provided between the gate electrode 18 and the drain electrode 14. The silicon carbide layer 10 is single crystal SiC. The silicon carbide layer 10 is, for example, 4H—SiC.

The silicon carbide layer 10 includes a first plane ("P1" in FIG. 3) and a second plane ("P2" in FIG. 3). The first plane P1 and the second plane P2 face each other. Hereinafter, the first plane may be referred to as a surface, and the second plane may be referred to as a back surface. Hereinafter, the "depth" means a depth based on the first plane.

The first plane P1 is, for example, a face inclined at 0° or more and 8° or less with respect to the (0001) face. In addition, the second plane P2 is, for example, a face inclined at 0° or more and 8° or less with respect to the (000-1) face. The (0001) face is referred to as a silicon face. The (000-1) face is referred to as a carbon face.

The drain region 26 of the n$^+$-type is provided on the back surface side of the silicon carbide layer 10. The drain region 26 contains, for example, nitrogen (N) as an n-type impurity. The n-type impurity concentration of the drain region 26 is, for example, $1 \times 10^{18}$ cm$^{-3}$ or more and $1 \times 10^{21}$ cm$^{-3}$ or less.

The drift region 28 of the n$^-$-type is provided between the drain region 26 and the first plane P1. The drift region 28 is provided between the source electrode 12 and the drain electrode 14. The drift region 28 is provided between the gate electrode 18 and the drain electrode 14.

The drift region 28 is provided on the drain region 26. The drift region 28 contains, for example, nitrogen (N) as an n-type impurity. The n-type impurity concentration of the drift region 28 is lower than the n-type impurity concentration of the drain region 26. The n-type impurity concentration of the drift region 28 is, for example, $4 \times 10^{14}$ cm$^{-3}$ or more and $1 \times 10^{17}$ cm$^{-3}$ or less. The thickness of the drift region 28 is, for example, 5 μm or more and 150 μm or less.

The drift region 28 includes a plurality of first portions 28a and a plurality of second portions 28b. The first portion 28a is in contact with the first plane P1. The first portion 28a is sandwiched between the two body regions 30. The first portion 28a functions as an n-type semiconductor region of the SBD. The first portion 28a extends, for example, in the second direction.

The second portion 28b is in contact with the first plane P1. The second portion 28b is sandwiched between the two p regions 32. The second portion 28b functions as an n-type semiconductor region of the SBD. The second portion 28b extends, for example, in the second direction.

The body region 30 of the p-type is provided between the drift region 28 and the first plane P1. A part of the body region 30 functions as a channel region of the MOSFET 100. The body region 30 functions as a p-type semiconductor region of a pn junction diode.

The body region 30 includes a low-concentration portion 30a and a high-concentration portion 30b. The high-concentration portion 30b is provided between the low-concentration portion 30a and the first plane P1. The p-type impurity concentration of the high-concentration portion 30b is higher than the p-type impurity concentration of the low-concentration portion 30a.

The body region 30 contains, for example, aluminum (Al) as a p-type impurity. The p-type impurity concentration of the low-concentration portion 30a is, for example, $1 \times 10^{16}$ cm$^{-3}$ or more and $5 \times 10^{17}$ cm$^{-3}$ or less. The p-type impurity concentration of the high-concentration portion 30b is, for example, $1 \times 10^{18}$ cm$^{-3}$ or more and $1 \times 10^{21}$ cm$^{-3}$ or less.

The depth of the body region 30 is, for example, 0.3 μm or more and 1.0 μm or less.

The body region 30 is fixed to the electric potential of the source electrode 12.

The p region 32 of the p-type is provided between the drift region 28 and the first plane P1. The p region 32 functions as a p-type semiconductor region of a pn junction diode.

The p region 32 includes a low-concentration portion 32a and a high-concentration portion 32b. The high-concentration portion 32b is provided between the low-concentration portion 32a and the first plane P1. The p-type impurity concentration of the high-concentration portion 32b is higher than the p-type impurity concentration of the low-concentration portion 32a.

The p region 32 contains, for example, aluminum (Al) as a p-type impurity. The p-type impurity concentration of the low-concentration portion 32a is, for example, $1 \times 10^{16}$ cm$^{-3}$ or more and $5 \times 10^{17}$ cm$^{-3}$ or less. The p-type impurity concentration of the high-concentration portion 32b is, for example, $1 \times 10^{18}$ cm$^{-3}$ or more and $1 \times 10^{21}$ cm$^{-3}$ or less.

The p-type impurity concentration of the low-concentration portion 32a of the p region 32 is substantially equal to, for example, the p-type impurity concentration of the low-concentration portion 30a of the body region 30.

The p-type impurity concentration of the high-concentration portion 32b of the p region 32 is substantially equal to, for example, the p-type impurity concentration of the high-concentration portion 30b of the body region 30.

For example, the width of the p region 32 in the first direction is larger than the width of the body region 30 in the first direction. The depth of the p region 32 is, for example, 0.3 μm or more and 1.0 μm or less.

The p region 32 is fixed to the electric potential of the source electrode 12.

The source region 34 of the n$^+$-type is provided between the body region 30 and the first plane P1. The source region 34 is provided between the low-concentration portion 30a of the body region 30 and the first plane P1. The source region 34 of the n$^+$-type extends, for example, in the second direction.

The source region 34 contains, for example, phosphorus (P) as an n-type impurity. The n-type impurity concentration of the source region 34 is higher than the n-type impurity concentration of the drift region 28.

The n-type impurity concentration of the source region 34 is, for example, $1\times10^{18}$ cm$^{-3}$ or more and $1\times10^{21}$ cm$^{-3}$ or less. The depth of the source region 34 is shallower than the depth of the body region 30. The depth of the source region 34 is, for example, 0.1 μm or more and 0.3 μm or less.

The first bottom region 36 of the n-type is provided between the drift region 28 and the body region 30. The first bottom region 36 is in contact with, for example, the drift region 28 and the body region 30. The width of the first bottom region 36 in the first direction is, for example, substantially the same as the width of the body region 30 in the first direction.

The first bottom region 36 contains, for example, nitrogen (N) as an n-type impurity. The n-type impurity concentration of the first bottom region 36 is higher than the n-type impurity concentration of the drift region 28.

The n-type impurity concentration of the first bottom region 36 is, for example, $1\times10^{16}$ cm$^{-3}$ or more and $2\times10^{17}$ cm$^{-3}$ or less. The thickness of the first bottom region 36 is, for example, 0.4 μm or more and 1.5 μm or less.

The second bottom region 38 of the n-type is provided between the drift region 28 and the p region 32. The second bottom region 38 is in contact with, for example, the drift region 28 and the p region 32. The width of the second bottom region 38 in the first direction is, for example, substantially the same as the width of the p region 32 in the first direction.

The second bottom region 38 contains, for example, nitrogen (N) as an n-type impurity. The n-type impurity concentration of the second bottom region 38 is higher than the n-type impurity concentration of the drift region 28. The n-type impurity concentration of the second bottom region 38 is, for example, substantially the same as the n-type impurity concentration of the first bottom region 36.

The n-type impurity concentration of the second bottom region 38 is, for example, $1\times10^{16}$ cm$^{-3}$ or more and $2\times10^{17}$ cm$^{-3}$ or less. The thickness of the second bottom region 38 is, for example, 0.4 μm or more and 1.5 μm or less.

The gate electrode 18 is provided on the first plane P1 side of the silicon carbide layer 10. The gate electrode 18 extends in the second direction parallel to the first plane P1 and perpendicular to the first direction. A plurality of gate electrodes 18 are disposed in parallel in the first direction. The gate electrode 18 has a so-called stripe shape.

The gate electrode 18 is a conductive layer. The gate electrode 18 is, for example, polycrystalline silicon containing p-type impurities or n-type impurities.

The gate electrode 18 faces, for example, a portion of the body region 30 in contact with the first plane P1. The gate electrode 18 faces, for example, a portion of the drift region 28 in contact with the first plane P1.

The gate insulating layer 16 is provided between the gate electrode 18 and the body region 30. The gate insulating layer 16 is provided between the gate electrode 18 and the drift region 28.

The gate insulating layer 16 is, for example, silicon oxide. For example, a High-k insulating material (high dielectric constant insulating material) can be applied to the gate insulating layer 16.

The interlayer insulating layer 20 is provided on the gate electrode 18 and the silicon carbide layer 10. The interlayer insulating layer 20 is provided between the gate electrode 18 and the source electrode 12. The interlayer insulating layer 20 has a function of electrically separating the gate electrode 18 and the source electrode 12. The interlayer insulating layer 20 is, for example, silicon oxide.

The source electrode 12 is provided on the first plane P1 side of the silicon carbide layer 10. The source electrode 12 is in contact with the first plane P1.

The source electrode 12 is in contact with the first portion 28a of the drift region 28, the second portion 28b of the drift region 28, the body region 30, the p region 32, and the source region 34.

The source electrode 12 has a first region 12a on the transistor region 101 and a second region 12b on the diode region 102.

The source electrode 12 contains metal. The metal forming the source electrode 12 is, for example, a stacked structure of titanium (Ti) and aluminum (Al).

The portion of the source electrode 12 in contact with the body region 30, the p region 32, and the source region 34 is, for example, metal silicide. Metal silicide is, for example, titanium silicide or nickel silicide. For example, metal silicide is not provided in a portion of the source electrode 12 in contact with the first portion 28a of the drift region 28 and the second portion 28b of the drift region 28.

The junction between the body region 30, the p region 32, and the source region 34 and the source electrode 12 is, for example, an ohmic junction. The junction between the first portion 28a of the drift region 28 and the second portion 28b of the drift region 28 and the source electrode 12 is, for example, a Schottky junction.

The drain electrode 14 is provided on the second plane P2 side of the silicon carbide layer 10. The drain electrode 14 is in contact with the second plane P2. The drain electrode 14 is in contact with the drain region 26.

The drain electrode 14 is, for example, a metal or a metal semiconductor compound. The drain electrode 14 contains, for example, at least one material selected from a group formed of nickel silicide, titanium (Ti), nickel (Ni), silver (Ag), and gold (Au).

The junction between the drain region 26 and the drain electrode 14 is, for example, an ohmic junction.

The gate electrode pad 22 is provided on the first plane P1 side of the silicon carbide layer 10. The gate electrode pad 22 is provided on the interlayer insulating layer 20. The gate electrode pad 22 is provided to implement electrical connection between the outside and the gate electrode 18.

The gate wiring 24 is provided on the first plane P1 side of the silicon carbide layer 10. The gate wiring 24 is connected to the gate electrode pad 22. The gate wiring 24 is electrically connected to the gate electrode 18.

A part of the gate wiring 24 extends in the first direction parallel to the first plane P1. A part of the gate wiring 24 extends in the second direction parallel to the first plane P1 and perpendicular to the first direction.

The gate electrode pad 22 and the gate wiring 24 contain metal. The metal forming the gate electrode pad 22 and the gate wiring 24 is, for example, a stacked structure of titanium (Ti) and aluminum (Al). The gate electrode pad 22 and the gate wiring 24 are formed of, for example, the same metal material as the source electrode 12.

The gate wiring 24 between the two source electrodes 12 extends in the first direction. The source electrode 12 is sandwiched between the two gate wirings 24 extending in the first direction. The source electrode 12 is sandwiched between the two gate wirings 24 extending in the second direction.

The sense electrode pad 25 is provided on the first plane P1 side of the silicon carbide layer 10. The sense electrode pad 25 is provided, for example, only in one transistor region among the plurality of transistor regions 101. The sense electrode pad 25 is provided, for example, in the first transistor region 101a. The sense electrode pad 25 is provided adjacent to the diode region 102.

The sense electrode pad 25 is separated from the source electrode 12. A distance between the sense electrode pad 25 and the source electrode 12 is smaller than, for example, a distance between the sense electrode pad 25 and the gate wiring 24. The minimum distance between the sense electrode pad 25 and the source electrode 12 is, for example, smaller than the minimum distance between the sense electrode pad 25 and the gate wiring 24.

The sense electrode pad 25 is in contact with the first portion 28a of the drift region 28, the second portion 28b of the drift region 28, the body region 30, the p region 32, and the source region 34.

The sense electrode pad 25 is provided to detect (sense) a short circuit between the source electrode 12 and the sense electrode pad 25. In addition, the sense electrode pad 25 is provided to detect (sense) the amount of on-current flowing through the MOSFET 100.

The sense electrode pad 25 contains metal. The metal forming the sense electrode pad 25 is, for example, a stacked structure of titanium (Ti) and aluminum (Al). The sense electrode pad 25 is formed of, for example, the same metal material as the source electrode 12, the gate electrode pad 22, and the gate wiring 24.

The area of the sense electrode pad 25 is, for example, 10% or less of the area of the source electrode 12.

As illustrated in FIG. 3, the transistor region 101 includes the silicon carbide layer 10, the source electrode 12 (first electrode), the drain electrode 14 (second electrode), the gate insulating layer 16, the gate electrode 18, and the interlayer insulating layer 20. The silicon carbide layer 10 of the transistor region 101 includes the drain region 26 of the n$^+$-type, the drift region 28 of the n$^-$-type (first silicon carbide region), the body region 30 of the p-type (second silicon carbide region), the source region 34 of the n$^+$-type (third silicon carbide region), and the first bottom region 36 of the n-type. The drift region 28 of the transistor region 101 includes the plurality of first portions 28a.

In the transistor region 101, the source electrode 12, the first portion 28a of the drift region 28, the drain region 26, and the drain electrode 14 form the SBD. The source electrode 12, the body region 30, the first bottom region 36, the drain region 26, and the drain electrode 14 form the pn junction diode.

A first distance (d1 in FIGS. 5A and 5B) between the two first portions 28a adjacent to each other with the body region 30 interposed therebetween is, for example, 3 μm or more and 30 μm or less.

As illustrated in FIG. 4, the diode region 102 includes the silicon carbide layer 10, the source electrode 12 (first electrode), and the drain electrode 14 (second electrode). The silicon carbide layer 10 of the diode region 102 includes the drain region 26 of the n$^+$-type, the drift region 28 of the n$^-$-type (first silicon carbide region), the p region 32 of the p-type (fourth silicon carbide region), and the second bottom region 38 of the n-type. The drift region 28 of the diode region 102 includes the plurality of second portions 28b.

In the diode region 102, the source electrode 12, the second portion 28b of the drift region 28, the drain region 26, and the drain electrode 14 form the SBD. The source electrode 12, the p region 32, the second bottom region 38, the drain region 26, and the drain electrode 14 form the pn junction diode.

A second distance (d2 in FIGS. 5A and 5B) between the two second portions 28b adjacent to each other with the p region 32 interposed therebetween is, for example, 3 μm or more and 30 μm or less. The second distance d2 between the two second portions 28b adjacent to each other with the p region 32 interposed therebetween is, for example, substantially equal to the first distance d1 between the two first portions 28a adjacent to each other with the body region 30 interposed therebetween. The first distance d1 and the second distance d2 are distances in the first direction.

Figure 6:
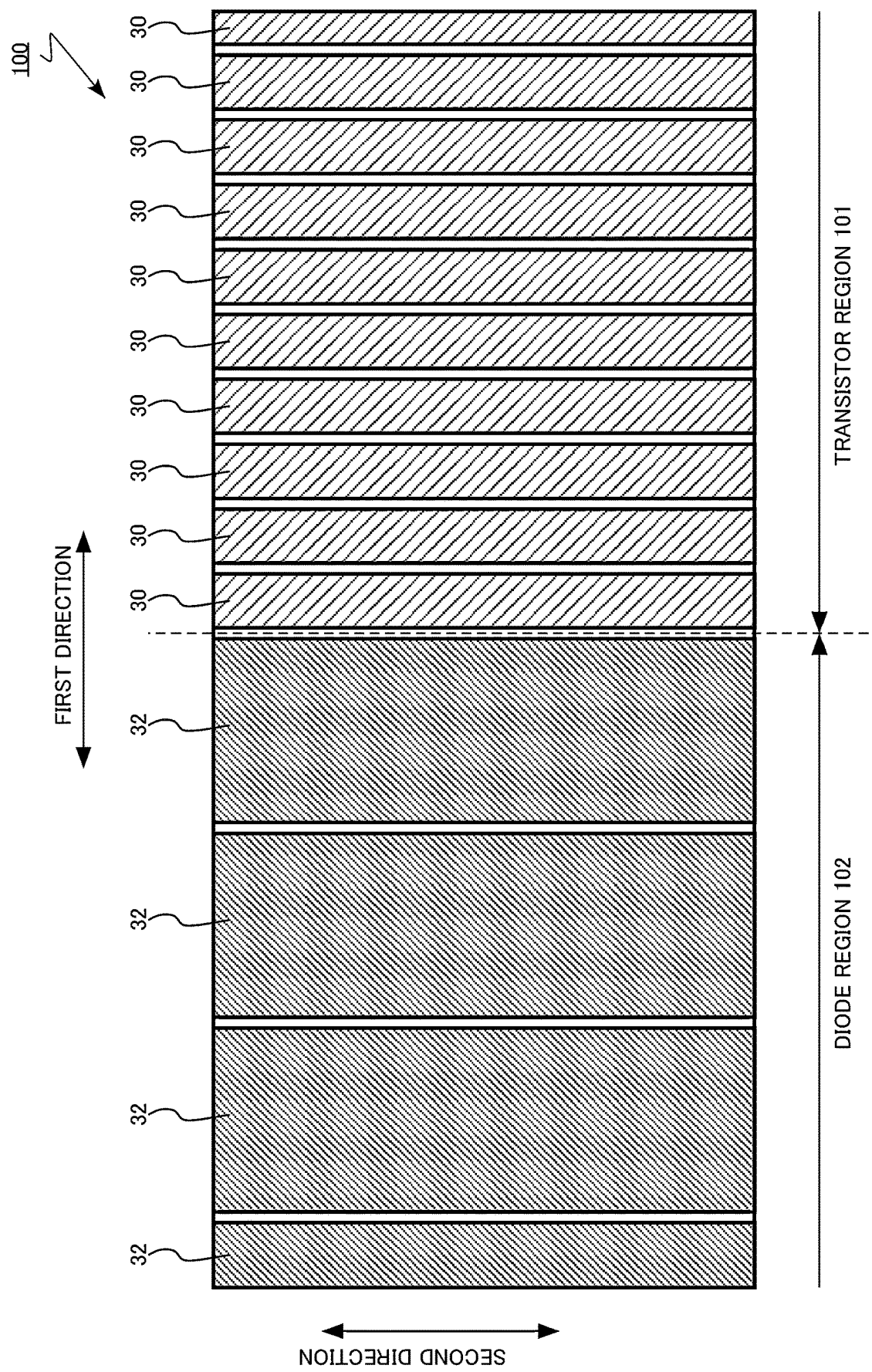
FIG. 6 is a schematic top view of the semiconductor device according to the first embodiment.

FIG. 6 is a schematic top view of the semiconductor device according to the first embodiment. FIG. 6 is a view illustrating a pattern of the body region 30 projected onto the first plane P1 and a pattern of the p region 32 projected onto the first plane P1. The pattern of the body region 30 and the pattern of the p region 32 in FIG. 6 are patterns projected onto the first plane P1 in a direction perpendicular to the first plane P1.

An occupancy rate per unit area of the p region 32 projected onto the first plane P1 on the first plane P1 is larger than an occupancy rate per unit area of the body region 30 projected onto the first plane P1 on the first plane P1. In other words, in the region of a predetermined size, the occupancy rate of the p region 32 projected onto the first plane P1 on the first plane P1 is larger than the occupancy rate of the body region 30 projected onto the first plane P1 on the first plane P1. The occupancy rate is, for example, an occupancy rate with respect to the transistor region 101 and the diode region 102 projected on the first plane P1. That is, the occupancy ratio of the pn junction diode in the diode region 102 is larger than the occupancy ratio of the pn junction diode in the transistor region 101.

The occupancy rate per unit area of the p region 32 projected onto the first plane P1 is, for example, 1.2 times or more and 3 times or less the occupancy rate per unit area of the body region 30 projected onto the first plane P1.

The unit area is not particularly limited as long as the average occupancy rate of the body region 30 of the transistor region 101 with the average occupancy rate of the p region 32 of the diode region 102 can be compared. The unit area is, for example, 30 μm×30 μm=900 μm$^2$.

In addition, a contact area per unit area between the source electrode 12 and the p region 32 in the diode region 102 is larger than a contact area per unit area between the source electrode 12 and the body region 30 in the transistor region 101. That is, contact resistance per unit area between the source electrode 12 and the p region 32 in the diode region 102 is smaller than contact resistance per unit area between the source electrode 12 and the body region 30 in the transistor region 101.

Figure 7:
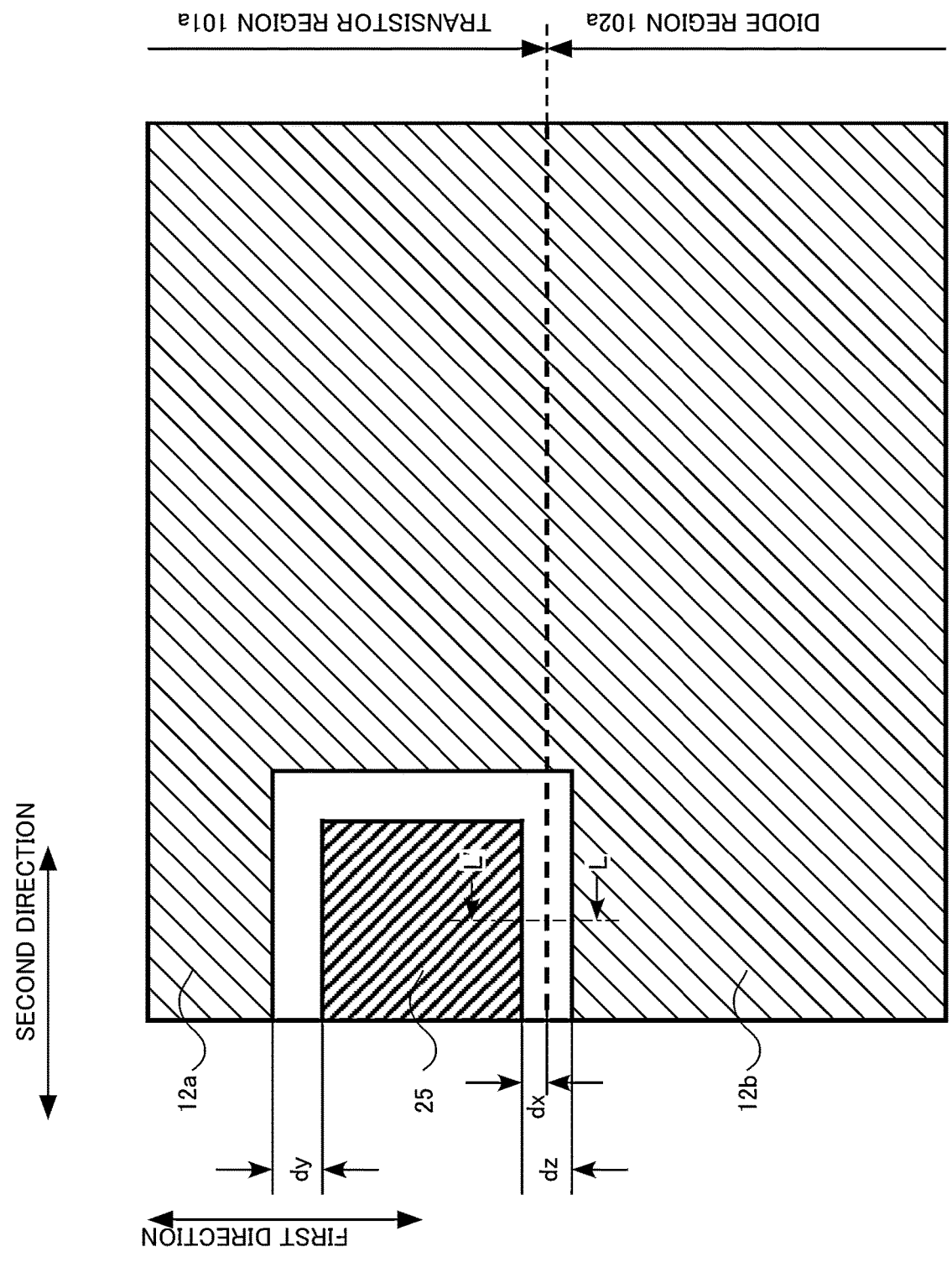
FIG. 7 is a schematic top view of the semiconductor device according to the first embodiment.
Figure 8:
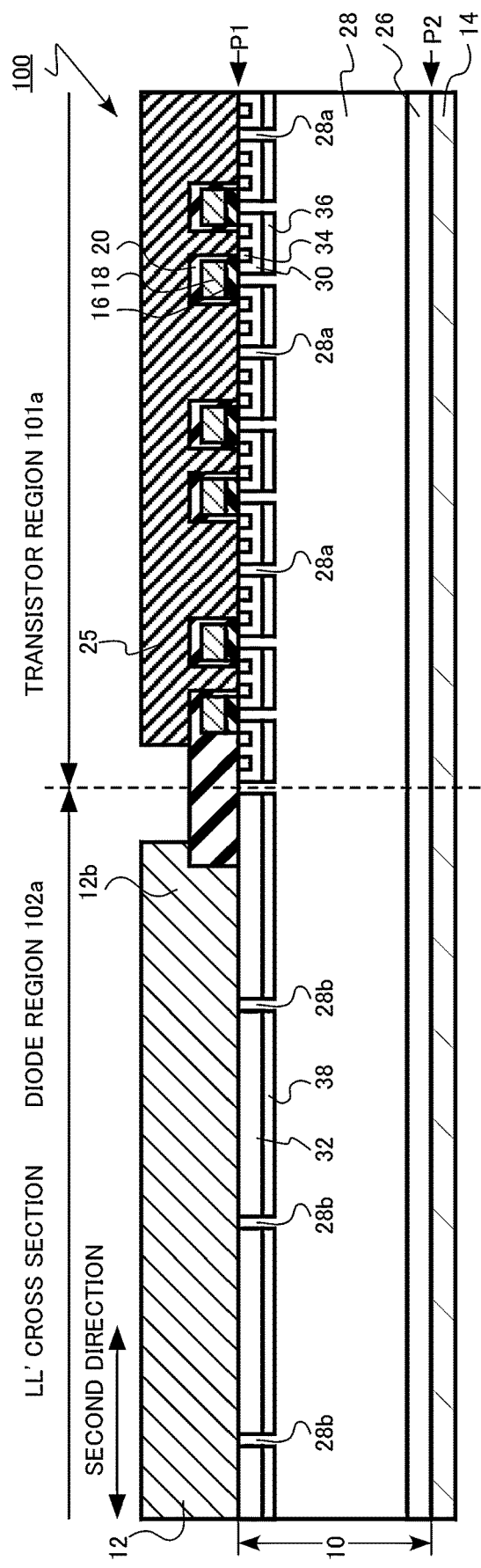
FIG. 8 is a schematic cross-sectional view of the semiconductor device according to the first embodiment.

FIG. 7 is a schematic top view of the semiconductor device according to the first embodiment. FIG. 8 is a schematic cross-sectional view of the semiconductor device according to the first embodiment. FIG. 8 is a cross-sectional view taken along line L-L' in FIG. 7. FIG. 7 illustrates the shape of the sense electrode pad 25 and the source electrode 12 around the sense electrode pad 25.

The sense electrode pad 25 is provided in the first transistor region 101a. The sense electrode pad 25 is provided in the vicinity of the first diode region 102a. The sense electrode pad 25 is provided, for example, adjacent to the first diode region 102a.

The sense electrode pad 25 is separated from the source electrode 12. The sense electrode pad 25 is separated from the first region 12a of the source electrode 12. In addition, the sense electrode pad 25 is separated from the second region 12b of the source electrode 12.

A distance (dx in FIG. 7) between the sense electrode pad 25 and the first diode region 102a is, for example, 100 μm or less.

The distance between the sense electrode pad 25 and the source electrode 12 is, for example, 100 μm or less. A distance (dy in FIG. 7) between the sense electrode pad 25 and the first region 12a of the source electrode 12 is, for example, 100 μm or less. In addition, a distance (dz in FIG. 7) between the sense electrode pad 25 and the second region 12b of the source electrode 12 is, for example, 100 μm or less.

The distance between the sense electrode pad 25 and the source electrode 12 is smaller than, for example, the distance between the gate wiring 24 and the source electrode 12. The minimum distance between the sense electrode pad 25 and the source electrode 12 is, for example, smaller than the minimum distance between the sense electrode pad 25 and the gate wiring 24.

The sense electrode pad 25 is in contact with the first portion 28a of the drift region 28, the second portion 28b of the drift region 28, the body region 30, the p region 32, and the source region 34.

Next, functions and effects of the semiconductor device according to the first embodiment will be described.

Figure 9B:
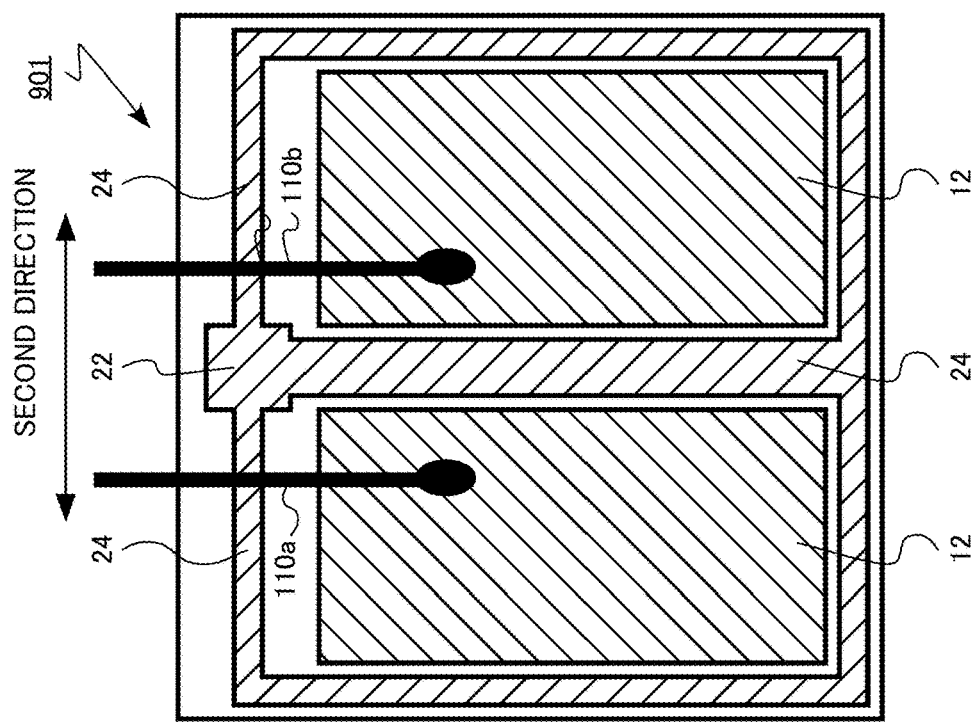
FIGS. 9A and 9B are schematic top views of a semiconductor device according to a first comparative example.
Figure 9A:
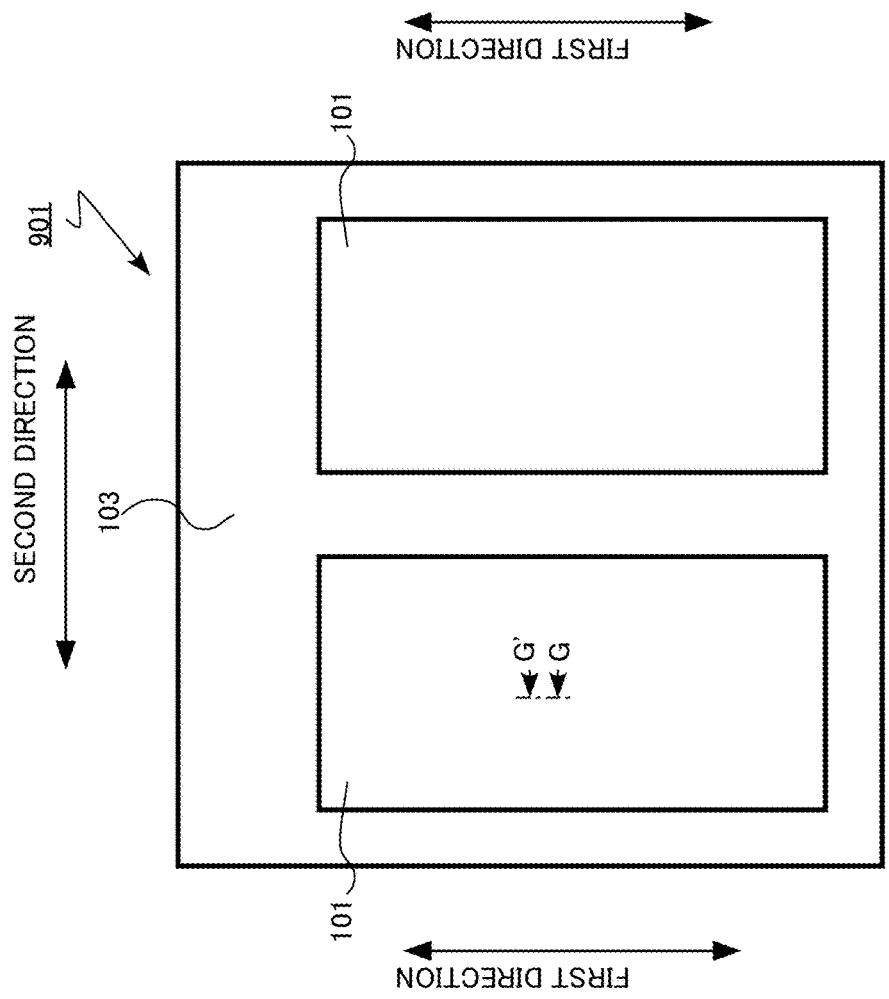

FIGS. 9A and 9B are schematic top views of a semiconductor device according to a first comparative example. FIG. 9A is an arrangement diagram of each region included in an MOSFET 901 of the first comparative example. FIG. 9B is a diagram showing a pattern of an electrode and a wiring on the upper face of the MOSFET 901 of the first comparative example. FIGS. 9A and 9B are views corresponding to FIGS. 2A and 2B of the first embodiment.

Figure 10:
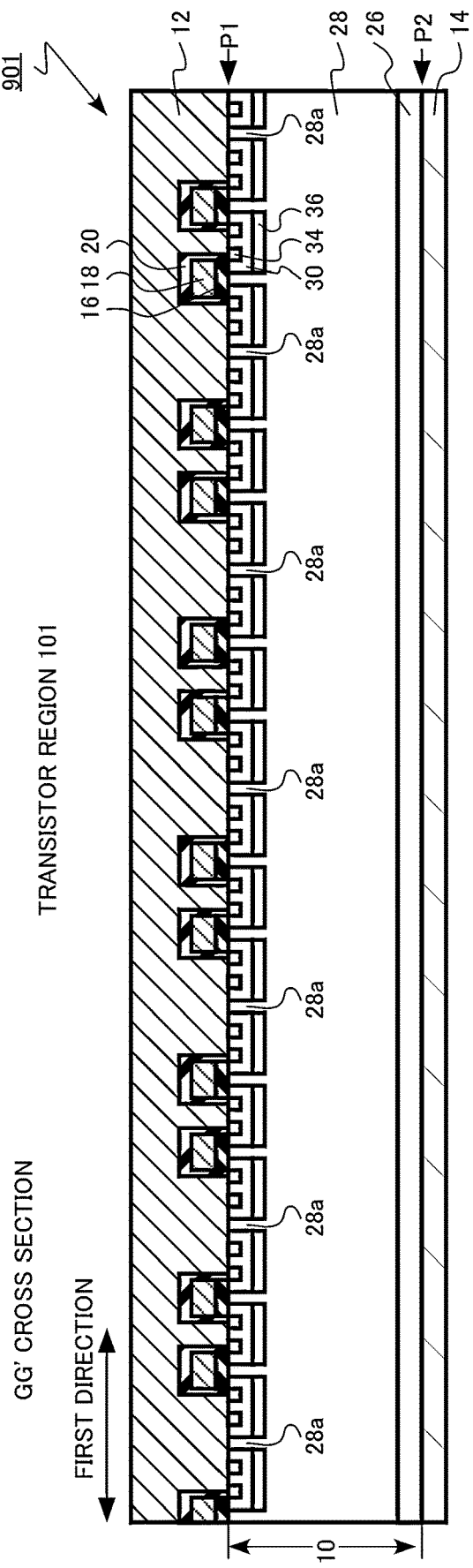
FIG. 10 is a schematic cross-sectional view of the semiconductor device according to the first comparative example.

FIG. 10 is a schematic cross-sectional view of the semiconductor device of the first comparative example. FIG. 10 is a cross-sectional view taken along line G-G' in FIG. 9A. FIG. 10 is a diagram corresponding to FIG. 5A of the first embodiment.

The MOSFET 901 of the first comparative example is different from the MOSFET 100 of the first embodiment in that the diode region 102 is not provided.

In the transistor region 101 of the MOSFET 901 of the first comparative example, the MOSFET and the SBD are provided in the same manner as that of the MOSFET 100 of the first embodiment.

Figure 11:
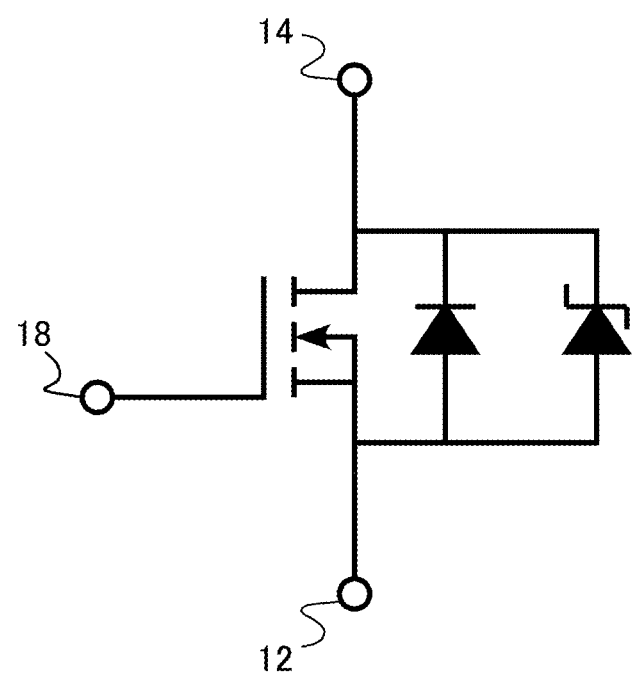
FIG. 11 is an equivalent circuit diagram of the semiconductor device according to the first comparative example.

FIG. 11 is an equivalent circuit diagram of the semiconductor device of the first comparative example. Between the source electrode 12 and the drain electrode 14, the pn junction diode and the SBD are connected as built-in diodes in parallel with the transistor.

For example, a case where the MOSFET is used as a switching element connected to an inductive load will be considered. When the MOSFET 901 is turned off, a voltage at which the source electrode 12 is positive with respect to the drain electrode 14 may be applied due to a load current caused by an inductive load. In this case, a forward current flows through the built-in diode. This state is also referred to as a reverse conduction state.

A forward voltage (Vf) at which a forward current starts flowing through the SBD is lower than a forward voltage (Vf) of the pn junction diode. Therefore, first, the forward current flows through the SBD.

The forward voltage (Vf) of the SBD is, for example, 1.0 V. The forward voltage (Vf) of the pn junction diode is, for example, 2.5 V.

The SBD performs unipolar operation. Therefore, even if a forward current flows, a stacking fault does not grow in the silicon carbide layer 10 due to recombination energy of carriers.

FIGS. 12A and 12B are explanatory diagrams of functions and effects of the semiconductor device according to the first embodiment. FIGS. 12A and 12B are schematic cross-sectional views of the semiconductor device according to the first comparative example. FIGS. 12A and 12B are views corresponding to FIG. 10.

FIGS. 12A and 12B are diagrams illustrating a current flowing through the built-in diode of the MOSFET 901 of the first comparative example. FIG. 12A illustrates a state in which a forward current flows only through the SBD, and FIG. 12B illustrates a state in which a forward current flows through the SBD and the pn junction diode.

That is, FIG. 12A illustrates a state in which the voltage applied between the pn junctions of the pn junction diode is lower than the forward voltage (Vf) of the pn junction diode. FIG. 12B illustrates a state in which the voltage applied between the pn junctions of the pn junction diode is higher than the forward voltage (Vf) of the pn junction diode.

In FIGS. 12A and 12B, a dotted arrow indicates a current flowing through the SBD. In FIG. 12B, a solid arrow indicates a current flowing through the pn junction diode.

As illustrated in FIG. 12A, the current flowing through the SBD flows around the bottom portion of the body region 30. Therefore, the electrostatic potential wraps around in the drift region 28 facing the bottom portion of the body region 30. The wraparound of the electrostatic potential reduces the voltage applied between the body region 30 and the drift region 28.

Therefore, at the bottom of the body region 30, the voltage hardly exceeds the forward voltage (Vf) of the pn junction diode. In other words, the forward voltage (Vf) of the pn junction diode of the MOSFET 901 of the first comparative example can be made higher than a case where the SBD is not provided. Therefore, bipolar operation of the pn junction diode is suppressed, and formation of a stacking fault in the silicon carbide layer 10 due to recombination energy of carriers is suppressed.

The forward voltage (Vf) of the pn junction diode of the MOSFET 901 of the first comparative example depends on a distance between two SBDs adjacent to each other in the first direction. By reducing the distance between the two SBDs adjacent to each other in the first direction, the forward voltage (Vf) of the pn junction diode of the MOSFET 901 of the first comparative example can be increased.

A large surge current exceeding a steady state may be instantaneously applied to the MOSFET. The surge current flows from the source electrode 12 toward the drain electrode 14.

When a large surge current flows, a large surge voltage is applied, and the MOSFET generates heat, which causes a breakdown of the MOSFET. The maximum allowable peak current value ($I_{FSM}$) of the surge current allowed in the MOSFET is referred to as a surge current tolerance. In the MOSFET having the SBD provided therein, it is desired to improve a surge current tolerance.

When a large surge voltage is applied to the MOSFET 901 of the first comparative example, the voltage applied between the pn junctions of the pn junction diode is higher than the forward voltage (Vf) of the pn junction diode.

When the voltage applied between the pn junctions of the pn junction diode becomes higher than the forward voltage (Vf) of the pn junction diode, a current also flows through the pn junction diode, as illustrated in FIG. 12B.

Figure 13:
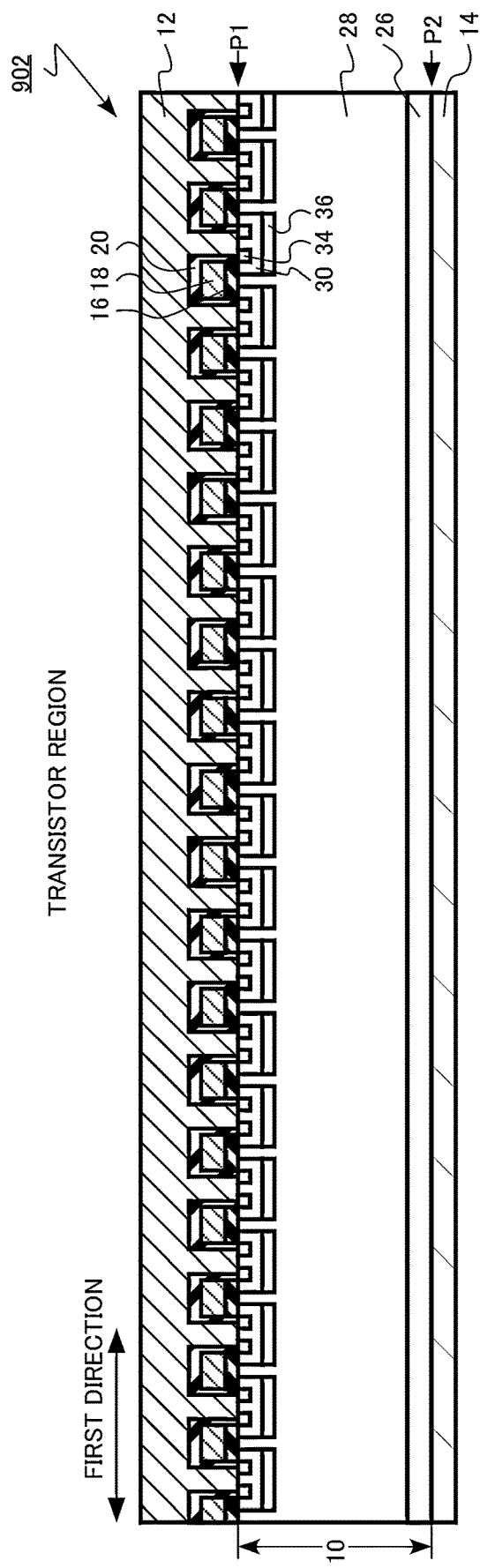
FIG. 13 is a schematic cross-sectional view of a semiconductor device according to a second comparative example.

FIG. 13 is a schematic cross-sectional view of a semiconductor device of a second comparative example. FIG. 13 is a diagram corresponding to FIG. 10 of the first comparative example.

An MOSFET 902 of the second comparative example is different from the MOSFET 901 of the first comparative example in that the transistor region does not include the SBD. The built-in diode of the MOSFET 902 of the second comparative example is only the pn junction diode.

Figure 14:
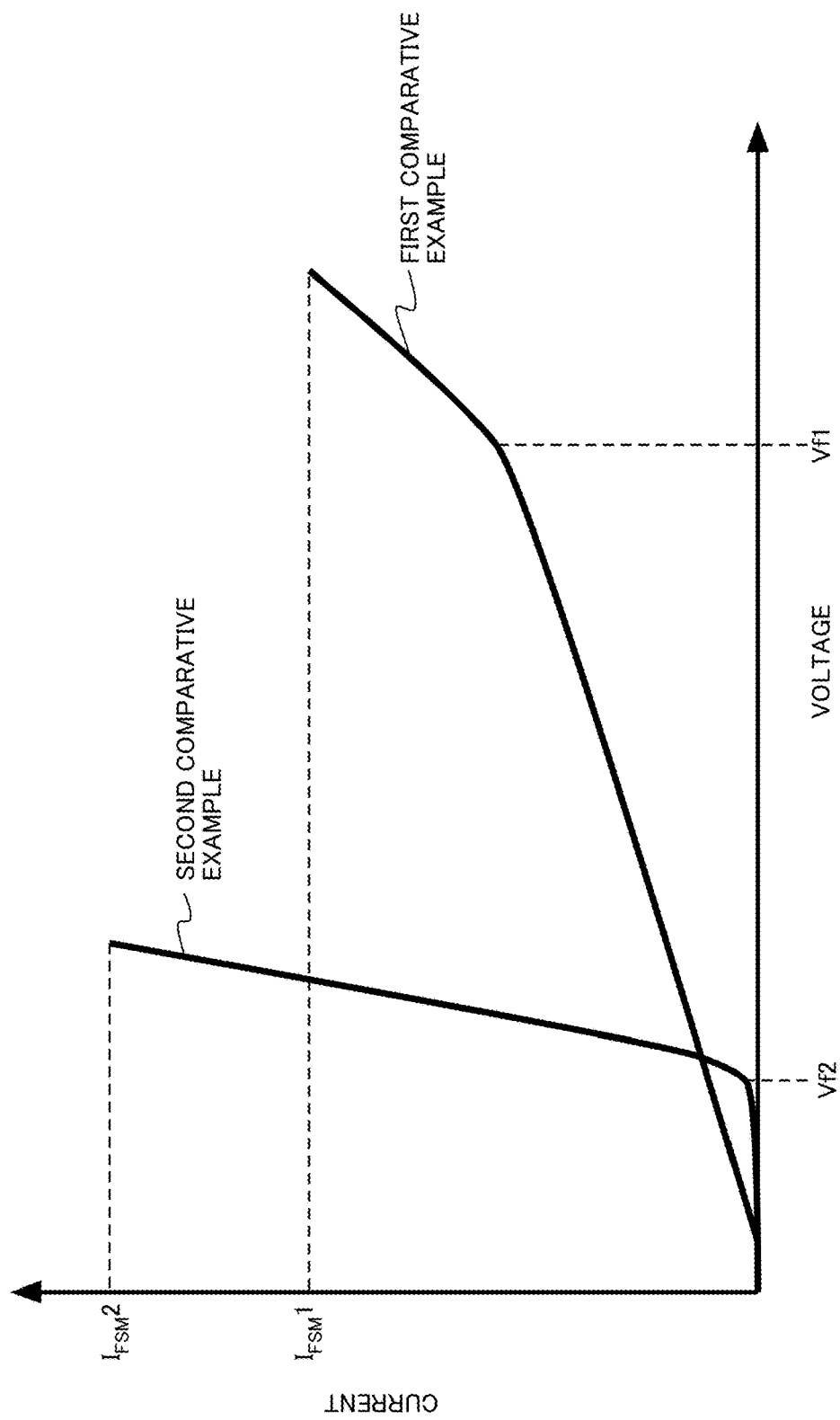
FIG. 14 is an explanatory diagram of the function and the effect of the semiconductor device according to the first embodiment.

FIG. 14 is an explanatory diagram of functions and effects of the semiconductor device according to the first embodiment. FIG. 14 is a diagram illustrating voltage-current characteristics of the built-in diodes of the MOSFET 901 of the first comparative example and the MOSFET 902 of the second comparative example.

As illustrated in FIG. 14, in the MOSFET 902 of the second comparative example, when a voltage equal to or higher than a forward voltage Vf2 of the pn junction diode is applied, a current flows through the pn junction diode. On the other hand, in the MOSFET 901 of the first comparative example, a current flows through the SBD until a forward voltage Vf1 of the pn junction diode is applied. In the MOSFET 901 of the first comparative example, when a voltage equal to or higher than the forward voltage Vf1 of the pn junction diode is applied, a current flows through the pn junction diode.

Since the MOSFET 901 of the first comparative example performs the unipolar operation up to the forward voltage Vf1, the slope of the current increase is smaller than that of the MOSFET 902 of the second comparative example. Therefore, a maximum allowable peak current value $I_{FSM}1$ of the MOSFET 901 of the first comparative example is smaller than a maximum allowable peak current value $I_{FSM}2$ of the MOSFET 902 of the second comparative example. In other words, a surge current tolerance of the MOSFET 901 of the first comparative example is smaller than a surge current tolerance of the MOSFET 902 of the second comparative example.

FIGS. 15A and 15B are explanatory diagrams of functions and effects of the semiconductor device according to the first embodiment. FIGS. 15A and 15B are schematic cross-sectional views of the MOSFET 100 of the first embodiment. FIGS. 15A and 15B are views corresponding to FIG. 5A.

FIGS. 15A and 15B are diagrams illustrating a current flowing through the built-in diode of the MOSFET 100 of the first embodiment. FIG. 15A illustrates a state in which a forward current flows only through the SBD, and FIG. 15B illustrates a state in which a forward current flows through the SBD and the pn junction diode.

That is, FIG. 15A illustrates a state in which the voltage applied between the pn junctions of the pn junction diode is lower than the forward voltage (Vf) of the pn junction diode. FIG. 15B illustrates a state in which the voltage applied between the pn junctions of the pn junction diode is higher than the forward voltage (Vf) of the pn junction diode.

In FIGS. 15A and 15B, a dotted arrow indicates a current flowing through the SBD. In FIG. 15B, a solid arrow indicates a current flowing through the pn junction diode.

The second distance d2 between the two second portions 28b adjacent to each other with the p region 32 interposed therebetween in the diode region 102 is substantially equal to the first distance d1 between the two first portions 28a adjacent to each other with the body region 30 interposed therebetween in the transistor region 101. In other words, the diode region 102 is provided with the second portion 28b at the same distance as the first portion 28a of the transistor region 101. In other words, an SBD region is provided in the diode region 102 at the same distance as the transistor region 101.

Therefore, as illustrated in FIG. 15A, in the diode region 102, the current flowing through the SBD flows around the bottom of the p region 32. Therefore, at the bottom portion of the p region 32, the voltage hardly exceeds the forward voltage (Vf) of the pn junction diode. The forward voltage (Vf) of the pn junction diode in the diode region 102 is increased by providing the SBD region.

When the voltage applied between the pn junctions of the pn junction diode becomes higher than the forward voltage (Vf) of the pn junction diode, a current also flows through the pn junction diode, as illustrated in FIG. 15B.

In the MOSFET 100 of the first embodiment, the occupancy rate per unit area of the p region 32 projected onto the first plane P1 is larger than the occupancy rate per unit area of the body region 30 projected onto the first plane P1. That is, the occupancy ratio of the pn junction diode in the diode region 102 is larger than the occupancy ratio of the pn junction diode in the transistor region 101.

In addition, a contact area per unit area between the source electrode 12 and the p region 32 in the diode region 102 is larger than a contact area per unit area between the source electrode 12 and the body region 30 in the transistor region 101. That is, contact resistance per unit area between the source electrode 12 and the p region 32 in the diode region 102 is smaller than contact resistance per unit area between the source electrode 12 and the body region 30 in the transistor region 101.

Therefore, the current flowing through the pn junction diode of the diode region 102 is larger than the current flowing through the pn junction diode of the transistor region 101.

In addition, when a large current flows through the pn junction diode of the diode region 102, carrier propagation and heat propagation to the adjacent transistor region 101 occur. Therefore, conductivity modulation of the transistor region 101 adjacent to the diode region 102 is promoted. Therefore, the current flowing through the pn junction diode of the transistor region 101 adjacent to the diode region 102 increases.

Figure 16:
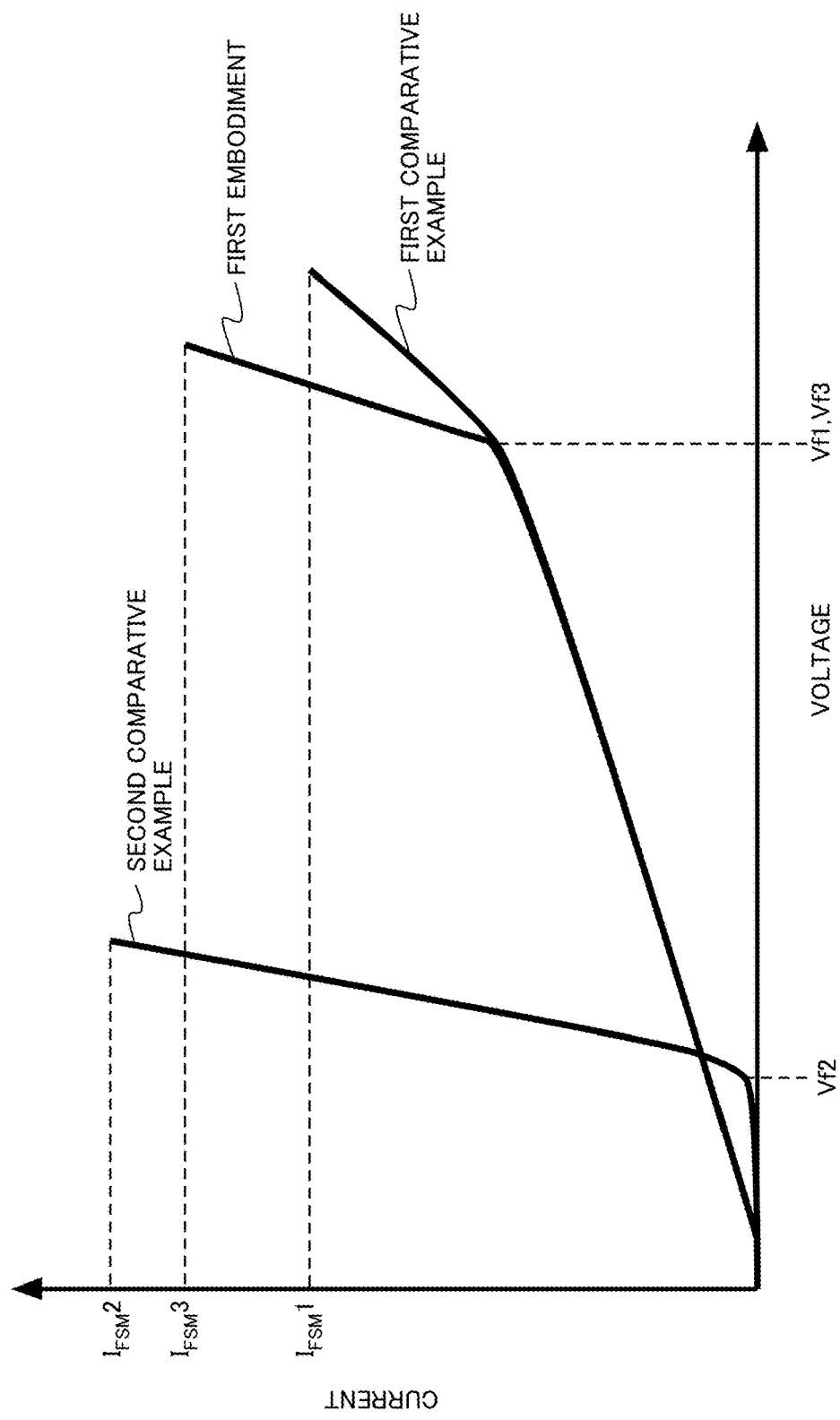
FIG. 16 is an explanatory diagram of the function and the effect of the semiconductor device according to the first embodiment.

FIG. 16 is an explanatory diagram of functions and effects of the semiconductor device according to the first embodiment. FIG. 15 is a diagram illustrating voltage-current characteristics of the built-in diodes of the MOSFET 901 of the first comparative example, the MOSFET 902 of the second comparative example, and the MOSFET 100 of the first embodiment.

As illustrated in FIG. 16, in the MOSFET 100 of the first embodiment, a current flows through the SBD until a forward voltage Vf3 of the pn junction diode is applied. In the MOSFET 100 of the first embodiment, when a voltage equal to or higher than the forward voltage Vf3 of the pn junction diode is applied, a current flows through the pn junction diode.

In the diode region 102 of the MOSFET 100 of the first embodiment, the SBD region is provided at the same distance as the transistor region 101. Therefore, the forward voltage Vf3 of the pn junction diode of the MOSFET 100 of the first embodiment is equal to the forward voltage Vf1 of the pn junction diode of the MOSFET of the first comparative example.

Meanwhile, the current after exceeding the forward voltage Vf3 of the pn junction diode in the MOSFET 100 of the first embodiment is larger than the current after exceeding the forward voltage Vf1 of the pn junction diode in the MOSFET 901 of the first comparative example. This is because the current flowing through the pn junction diode of the diode region 102 and the pn junction diode of the transistor region 101 adjacent to the diode region 102 is larger than that of the MOSFET 901 of the first comparative example.

Since the current after exceeding the forward voltage Vf3 of the pn junction diode increases, a maximum allowable peak current value $I_{FSM}3$ of the MOSFET 100 of the first embodiment becomes larger than the maximum allowable peak current value $I_{FSM}1$ of the MOSFET 901 of the first comparative example. In other words, the surge current tolerance of the MOSFET 100 of the first embodiment is larger than the surge current tolerance of the MOSFET 901 of the first comparative example.

As described above, the MOSFET 100 of the first embodiment includes the diode region 102 provided between the transistor regions 101, thereby improving the surge current tolerance.

The occupancy rate per unit area of the p region 32 projected onto the first plane P1 is preferably 1.2 times or more and 3 times or less the occupancy rate per unit area of the body region 30 projected onto the first plane P1. By exceeding the lower limit value, the surge current tolerance is further improved. In addition, by falling below the upper limit value, a decrease in the forward voltage Vf3 is suppressed, and a decrease in reliability is suppressed.

According to failure analysis by the inventors, it has become clear that one of the causes of chip breakage due to a surge current is a short circuit between the source electrode 12 and the gate wiring 24. The short circuit between the source electrode 12 and the gate wiring 24 occurs when the source electrode 12 adjacent to the gate wiring 24 melts and flows in the lateral direction to come into contact with the gate wiring 24.

It has become clear that the short circuit between the source electrode 12 and the gate wiring 24 is particularly likely to occur between the source electrode 12 of the diode region 102 and the gate wiring 24. That is, it has become clear that the short circuit between the source electrode 12 and the gate wiring 24 is particularly likely to occur between the second region 12*b* and the gate wiring 24 of the source electrode 12.

The reason why the short circuit is likely to occur between the second region 12*b* and the gate wiring 24 is considered to be that a surge current flowing through the diode region 102 is larger than that flowing through the transistor region 101, and thus a calorific value is larger. That is, it is considered that this is because the source electrode 12 easily melts as the calorific value increases.

Therefore, for example, an MOSFET in which melting of the second region 12*b* has already occurred by use of the MOSFET can be understood to be an MOSFET having a low surge current tolerance. Since the MOSFET having a low surge current tolerance has reduced its reliability, it is desirable to replace the MOSFET before a failure occurs.

Figure 17:
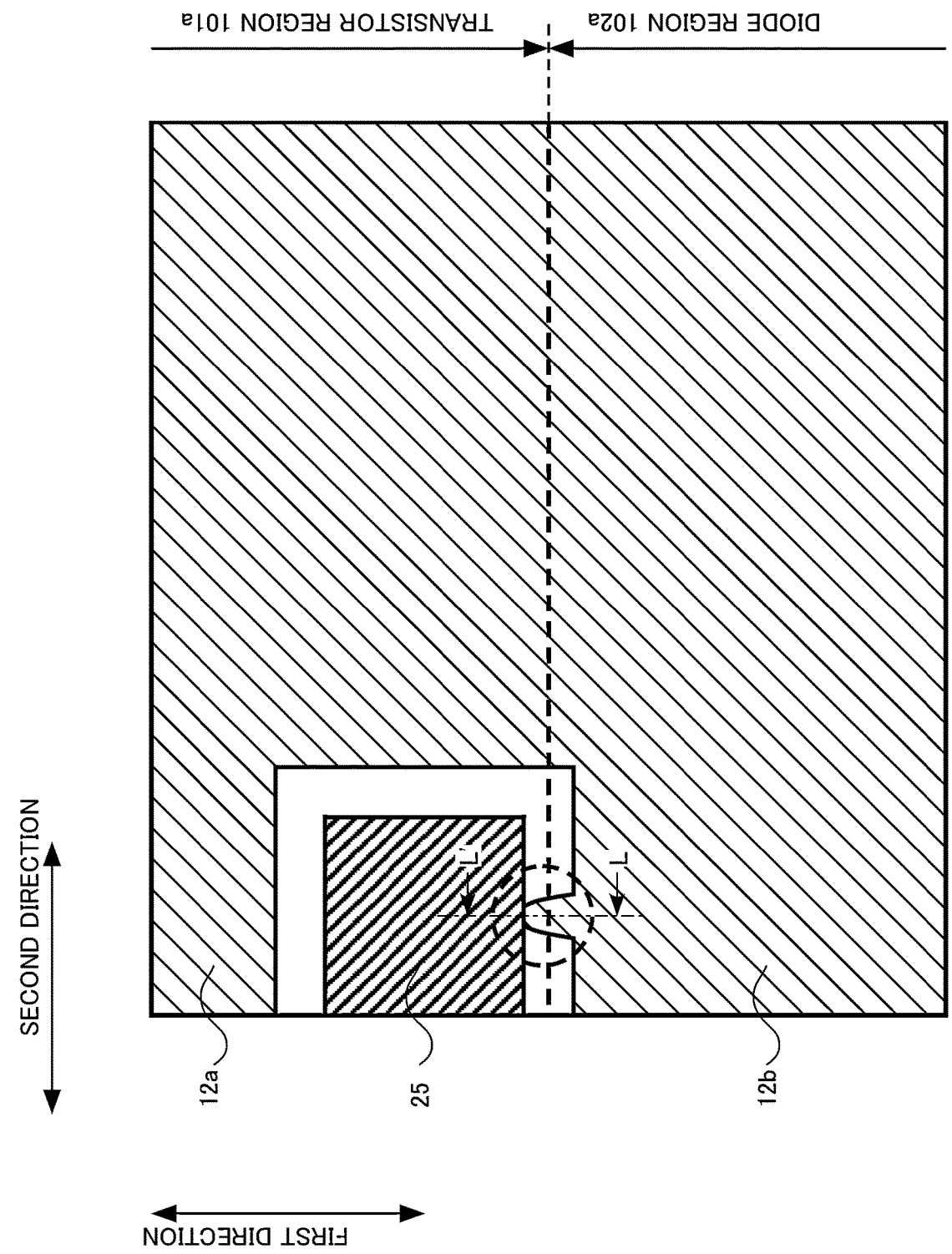
FIG. 17 is an explanatory diagram of functions and effects of the semiconductor device according to the first embodiment.
Figure 18:
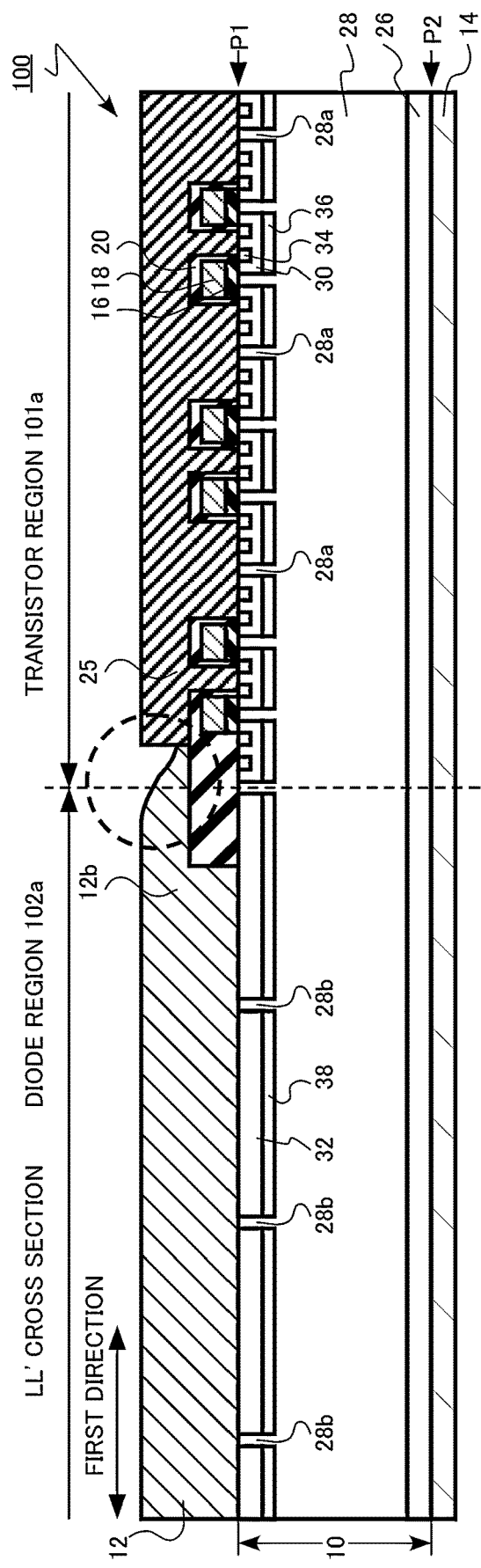
FIG. 18 is an explanatory diagram of functions and effects of the semiconductor device according to the first embodiment.

FIGS. 17 and 18 are explanatory diagrams of functions and effects of the semiconductor device according to the first embodiment. FIG. 17 is a diagram corresponding to FIG. 7. FIG. 18 is a diagram corresponding to FIG. 8.

The MOSFET 100 of the discrete device 1000 according to the first embodiment includes the sense electrode pad 25 configured to detect the short circuit between the source electrode 12 and the sense electrode pad 25. The sense electrode pad 25 is provided close to the diode region 102 where the source electrode 12 is likely to melt.

For example, in the discrete device 1000, a source voltage is applied to the fourth metal lead 130*d* connected to the sense electrode pad 25. Then, the current flowing through the fourth metal lead 130*d* is monitored by an ammeter outside the discrete device 1000.

A case where the second region 12*b* of the first diode region 102*a* melts and short-circuits with the sense electrode pad 25, as indicated by dotted circles in FIGS. 17 and 18, will be considered. In this case, a current flowing from the sense electrode pad 25 to the second region 12*b* increases a current flowing through the fourth metal lead 130*d*.

Therefore, a short circuit between the second region 12*b* of the source electrode 12 and the sense electrode pad 25 can be detected. In other words, a decrease in the reliability of the MOSFET 100, that is, a decrease in the reliability of the discrete device 1000 can be detected.

If the decrease in the reliability of the discrete device 1000 is detected, an early failure of the discrete device 1000 is predicted. Thus, for example, the discrete device 1000 is replaced with a new discrete device.

As described above, the discrete device 1000 can predict a decrease in reliability.

From the viewpoint of early detection of melting of the source electrode 12, the distance (dx in FIG. 7) between the sense electrode pad 25 and the first diode region 102*a* is preferably 100 μm or less, more preferably 50 μm or less, and still more preferably 10 μm or less.

From the viewpoint of early detection of melting of the source electrode 12, the distance between the sense electrode pad 25 and the source electrode 12 is preferably 100 μm or less, more preferably 50 μm or less, and still more preferably 10 μm or less.

From the viewpoint of early detection of melting of the source electrode 12, the distance (dz in FIG. 7) between the sense electrode pad 25 and the second region 12*b* of the source electrode 12 is preferably 100 μm or less, more preferably 50 μm or less, and still more preferably 10 μm or less.

From the viewpoint of early detection of melting of the source electrode 12, the distance between the sense electrode pad 25 and the source electrode 12 is preferably smaller than the distance between the gate wiring 24 and the source electrode 12. Since the distance between the sense electrode pad 25 and the source electrode 12 is shorter than the distance between the gate wiring 24 and the source electrode 12, melting of the source electrode 12 can be detected before the gate wiring 24 and the source electrode 12 are short-circuited.

In addition, since the MOSFET 100 of the discrete device 1000 according to the first embodiment includes the sense electrode pad 25, the on-current amount of the MOSFET 100 can be detected (sensed).

The area of the sense electrode pad 25 is preferably 10% or less, and more preferably 5% or less of the area of the source electrode 12 from the viewpoint of reducing the amount of on-current flowing through the sense electrode pad 25 and facilitating detection of the amount of on-current by the ammeter.

(Modification)

A semiconductor device according to a modification of the first embodiment is different from the semiconductor device according to the first embodiment in that a third electrode is not in contact with a plurality of first portions, a second silicon carbide region, and a third silicon carbide region.

Figure 19:
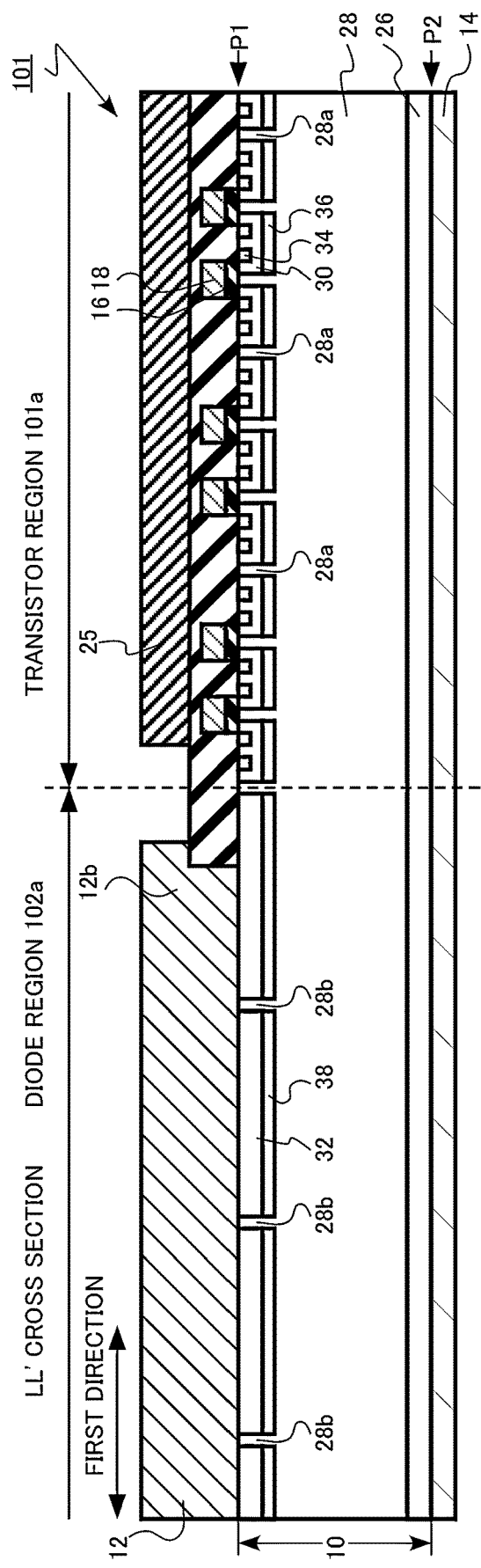
FIG. 19 is a schematic cross-sectional view of a modification of the first embodiment.

FIG. 19 is a schematic cross-sectional view of the modification of the first embodiment. FIG. 19 is a diagram corresponding to FIG. 8 of the first embodiment.

In an MOSFET 101 included in a discrete device of the modification of the first embodiment, the sense electrode pad 25 is not in contact with the first portion 28a of the drift region 28, the second portion 28b of the drift region 28, the body region 30, the p region 32, and the source region 34.

In the semiconductor device according to the modification of the first embodiment, an on-current does not flow through the sense electrode pad 25. Therefore, when the second region 12b of the first diode region 102a melts and short-circuits with the sense electrode pad 25, a current flows through the sense electrode pad 25 for the first time. Therefore, detection accuracy of melting of the source electrode 12 is improved.

As described above, according to the first embodiment and the modification, a discrete device with an improved surge current tolerance is realized. Furthermore, according to the first embodiment, a discrete device capable of predicting a decrease in reliability is realized.

Second Embodiment

A semiconductor device according to a second embodiment includes a plurality of transistor regions and at least one diode region, wherein the plurality of transistor regions include a silicon carbide layer having a first plane and a second plane facing the first plane, the silicon carbide layer including a first silicon carbide region of n-type having a plurality of first portions in contact with the first plane, a second silicon carbide region of p-type provided between the first silicon carbide region and the first plane, and a third silicon carbide region of n-type provided between the second silicon carbide region and the first plane, a first electrode in contact with the plurality of first portions, the second silicon carbide region, and the third silicon carbide region, a second electrode in contact with the second plane, a gate electrode facing the second silicon carbide region, and a gate insulating layer provided between the gate electrode and the second silicon carbide region, wherein the at least one diode region includes the silicon carbide layer including the first silicon carbide region of n-type having a plurality of second portions in contact with the first plane and a fourth silicon carbide region of p-type provided between the first silicon carbide region and the first plane, the first electrode in contact with the plurality of second portions and the fourth silicon carbide region, and the second electrode, wherein an occupied area per unit area of the fourth silicon carbide region projected onto the first plane is larger than an occupied area per unit area of the second silicon carbide region projected onto the first plane, wherein a first diode region, which is one of the at least one diode region, is provided between a first transistor region, which is one of the plurality of transistor regions, and a second transistor region, which is one of the plurality of transistor regions provided in a first direction with respect to the first transistor region, and wherein the first transistor region includes a third electrode provided on a side of the first plane of the silicon carbide layer and separated from the first electrode.

The semiconductor device according to the second embodiment has the same configuration as that of the MOSFET 100 of the first embodiment. The second embodiment is different from the first embodiment in that the semiconductor device according to the first embodiment is a discrete device, whereas the semiconductor device according to the second embodiment is a semiconductor chip. Hereinafter, some descriptions of contents overlapping with the first embodiment may be omitted.

Figure 20B:
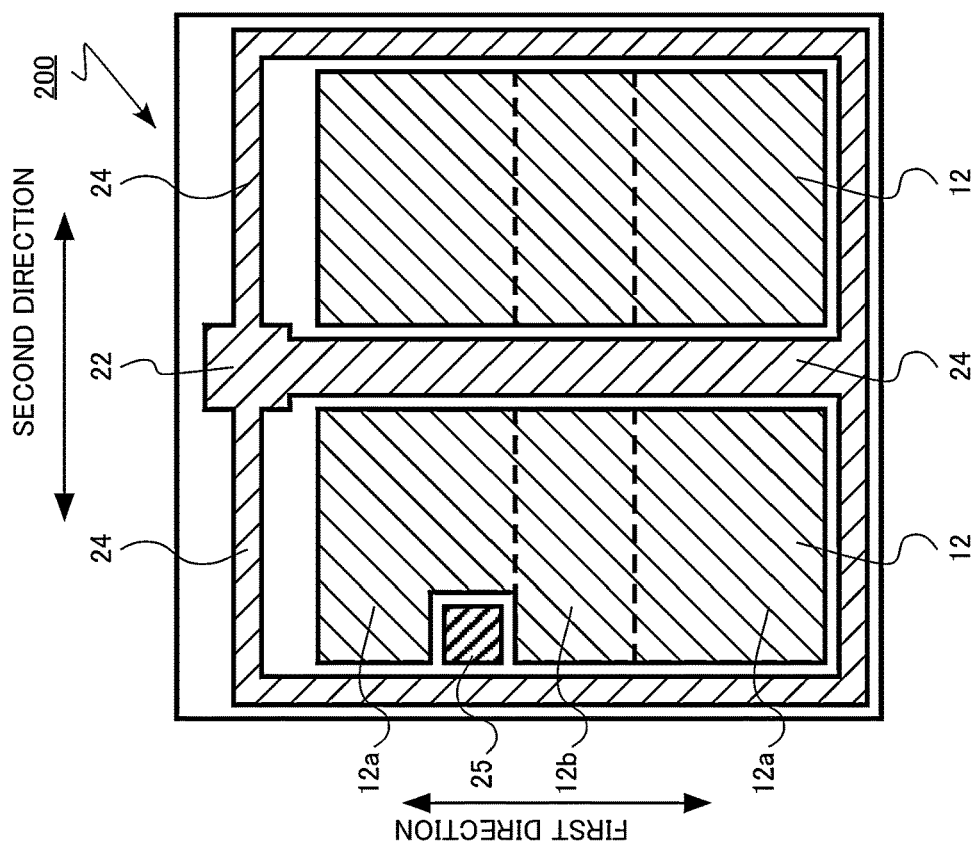
FIGS. 20A and 20B are schematic top views of a semiconductor device according to a second embodiment.
Figure 20A:
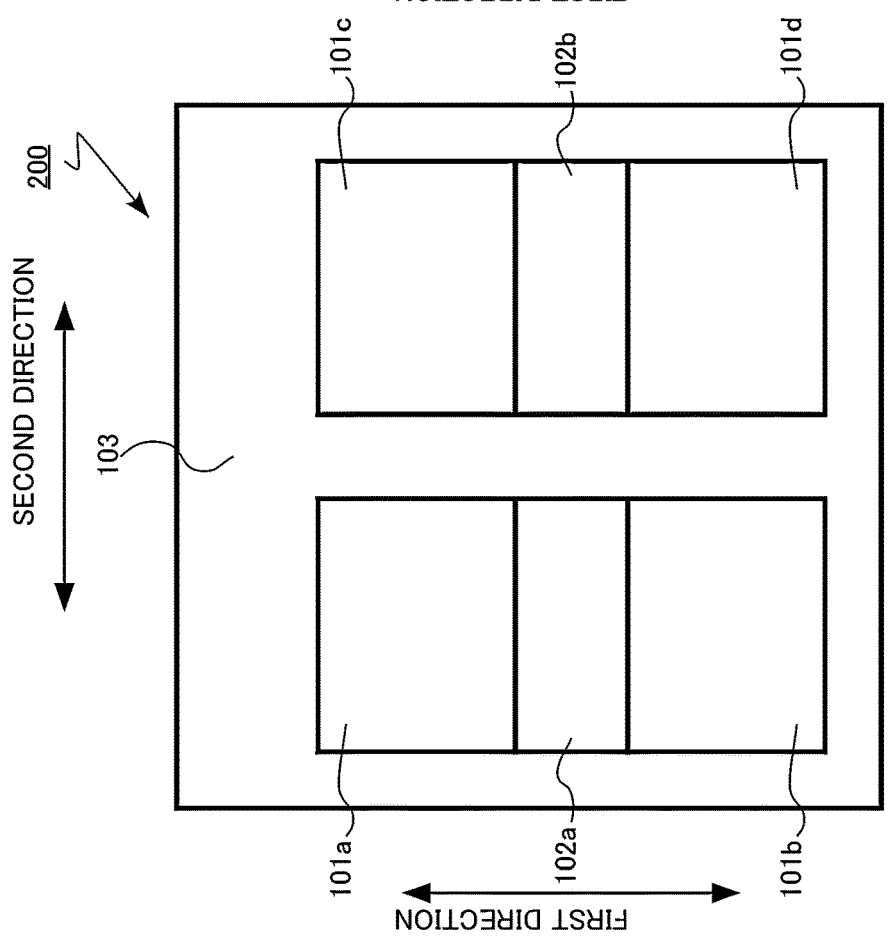

FIGS. 20A and 20B are schematic top views of the semiconductor device according to the second embodiment. FIG. 20A is an arrangement diagram of each region included in an MOSFET 200 of the second embodiment. FIG. 20B is a diagram illustrating a pattern of an electrode and a wiring on the upper face of the MOSFET 200.

The MOSFET 200 of the second embodiment has the same configuration as that of the MOSFET 100 of the first embodiment. The MOSFET 200 is a semiconductor chip. The MOSFET 200 is an example of a semiconductor device.

According to the MOSFET 200 of the second embodiment, a surge current tolerance is improved in the same manner as that of the MOSFET 100 of the first embodiment. Furthermore, for example, as in the MOSFET 100 of the first embodiment, it is possible to predict a decrease in reliability by being incorporated in a discrete device.

As described above, according to the second embodiment, it is possible to implement the MOSFET configured to improve the surge current tolerance. In addition, according to the second embodiment, an MOSFET capable of predicting a decrease in reliability is realized.

Third Embodiment

A semiconductor device according to a third embodiment is different from the semiconductor device according to the second embodiment in that eight transistor regions and ten diode regions are provided. Hereinafter, some descriptions of contents overlapping with the contents of the first embodiment or the second embodiment may be omitted.

Figure 21B:
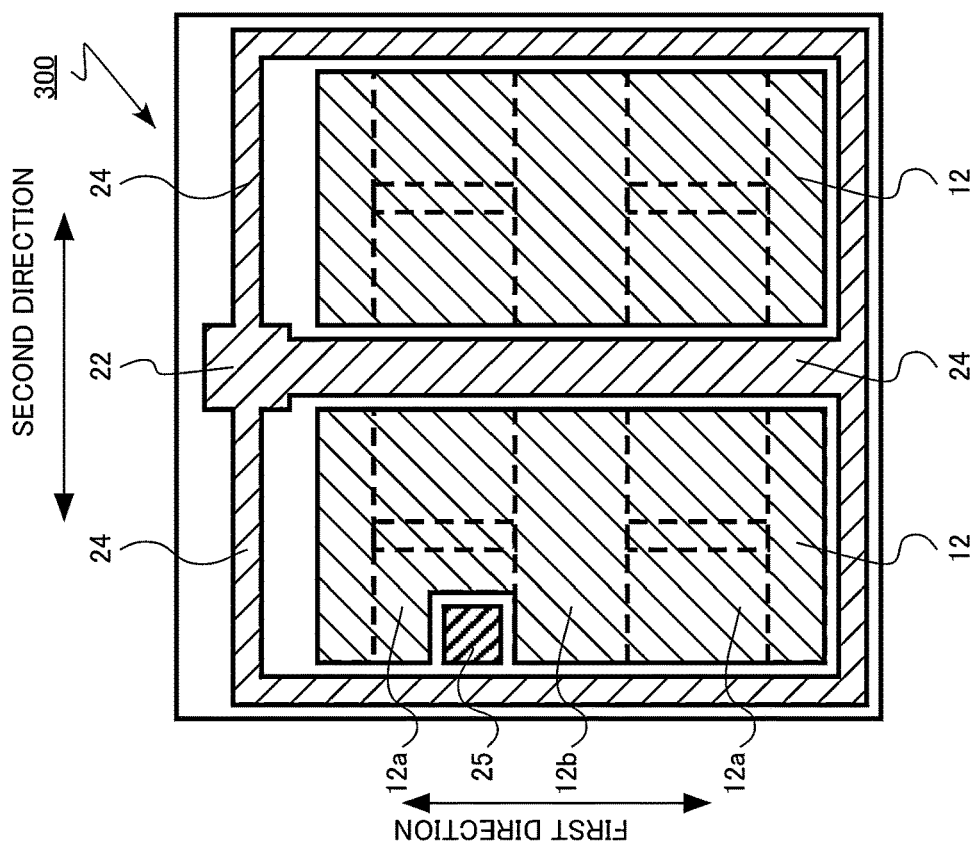
FIGS. 21A and 21B are schematic top views of a semiconductor device according to a third embodiment.
Figure 21A:
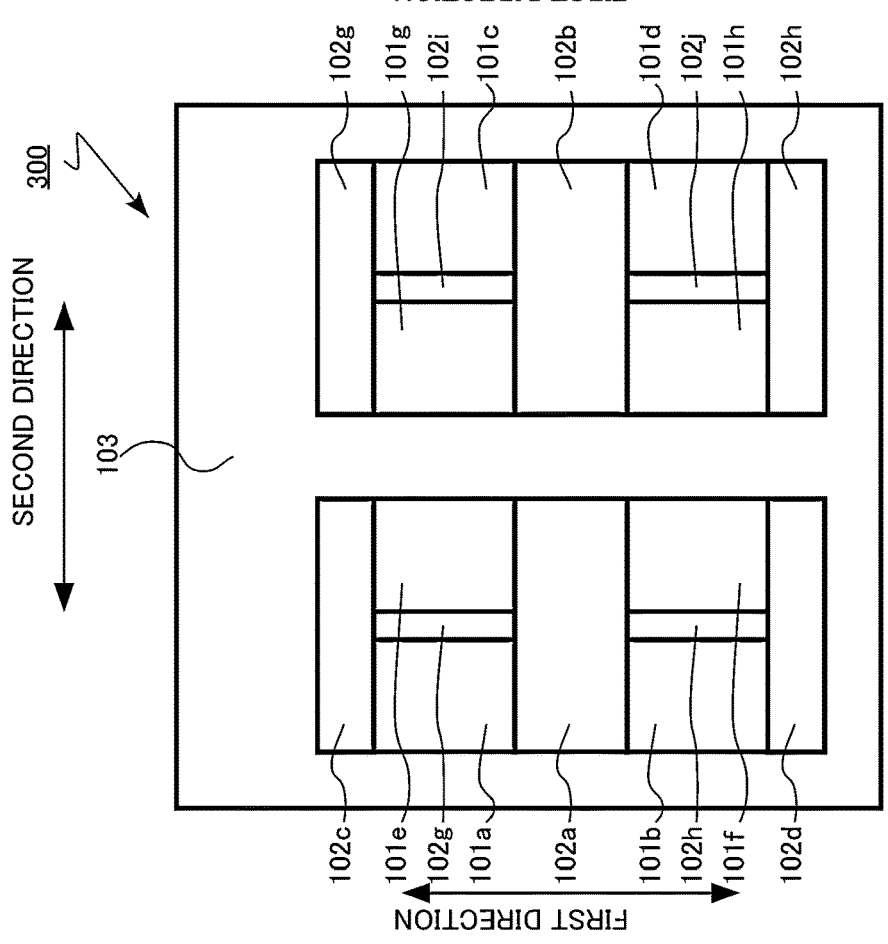

FIGS. 21A and 21B are schematic top views of the semiconductor device according to the third embodiment. FIG. 21A is an arrangement diagram of each region included in an MOSFET 300 of the third embodiment. FIG. 21B is a diagram illustrating a pattern of an electrode and a wiring on the upper face of the MOSFET 300.

The MOSFET 300 includes a transistor region 101a (first transistor region), a transistor region 101b (second transistor region), a transistor region 101c, a transistor region 101d, a transistor region 101e, a transistor region 101f, a transistor region 101g, a transistor region 101h, a diode region 102a (first diode region), a diode region 102b, a diode region 102c, a diode region 102d, a diode region 102e, a diode region 102f, a diode region 102g, a diode region 102h, a diode region 102i, a diode region 102j, and a peripheral region 103. The transistor region 101a is an example of a first transistor region. The transistor region 101b is an example of a second transistor region. The diode region 102a is an example of a first diode region.

According to the MOSFET 300 of the third embodiment, a surge current tolerance is improved in the same manner as that of the MOSFET 100 of the first embodiment. Furthermore, for example, as in the MOSFET 100 of the first embodiment, it is possible to predict a decrease in reliability by being incorporated in a discrete device.

As described above, according to the third embodiment, it is possible to implement the MOSFET configured to improve the surge current tolerance. In addition, according to the third embodiment, an MOSFET capable of predicting a decrease in reliability is realized.

Fourth Embodiment

An inverter circuit and a driving device according to a fourth embodiment are an inverter circuit and a driving device including the semiconductor device according to the first embodiment.

Figure 22:
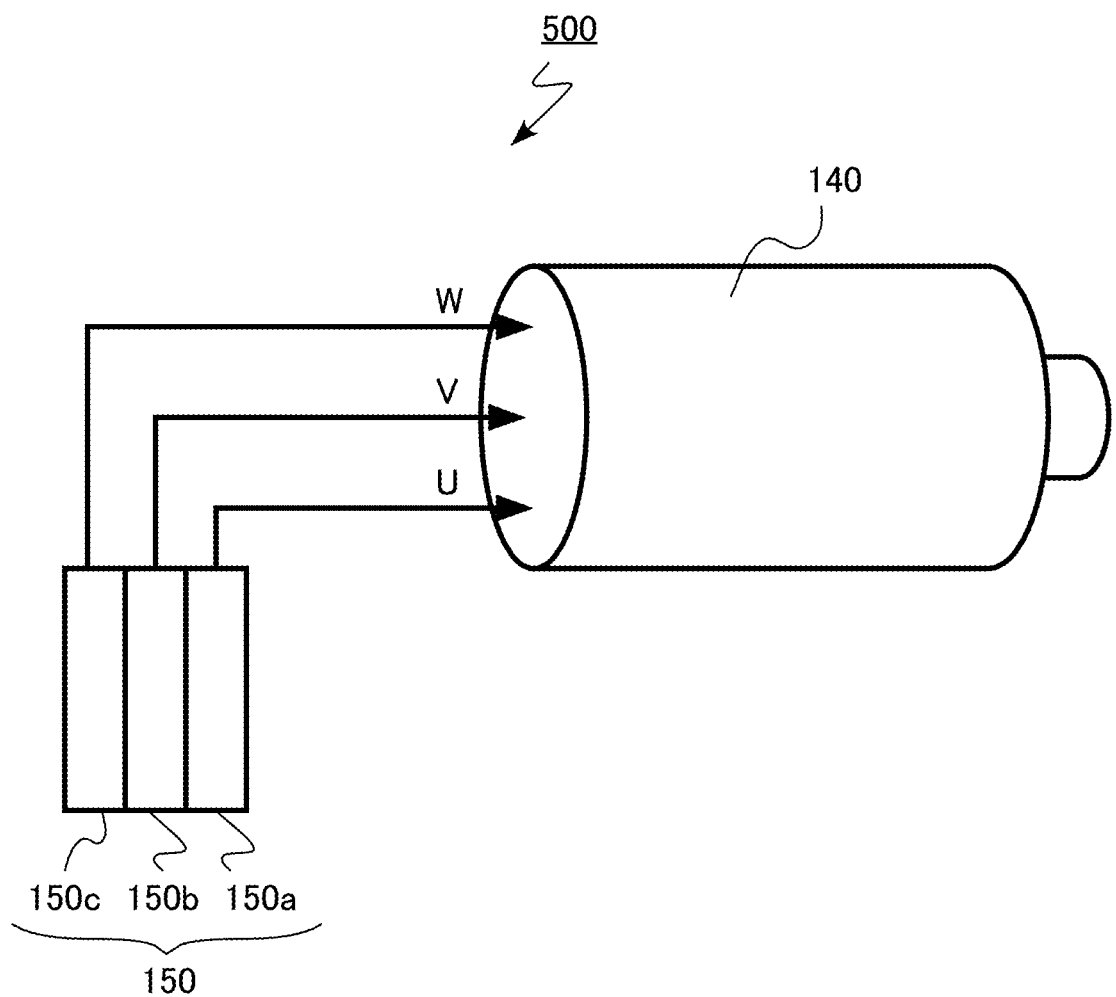
FIG. 22 is a schematic diagram of a driving device according to a fourth embodiment.

FIG. 22 is a schematic diagram of the driving device according to the fourth embodiment. A driving device 500 includes a motor 140 and an inverter circuit 150.

The inverter circuit 150 includes three semiconductor modules 150a, 150b, and 150c using the MOSFET 100 of the first embodiment as a switching element. By connecting the three semiconductor modules 150a, 150b, and 150c in parallel, a three-phase inverter circuit 150 including three AC voltage output terminals U, V, and W is implemented. The motor 140 is driven by the AC voltage output from the inverter circuit 150.

According to the fourth embodiment, the characteristics of the inverter circuit 150 and the driving device 500 are improved by including the MOSFET 100 with improved characteristics.

Fifth Embodiment

A vehicle according to a fifth embodiment is a vehicle including the semiconductor device according to the first embodiment.

Figure 23:
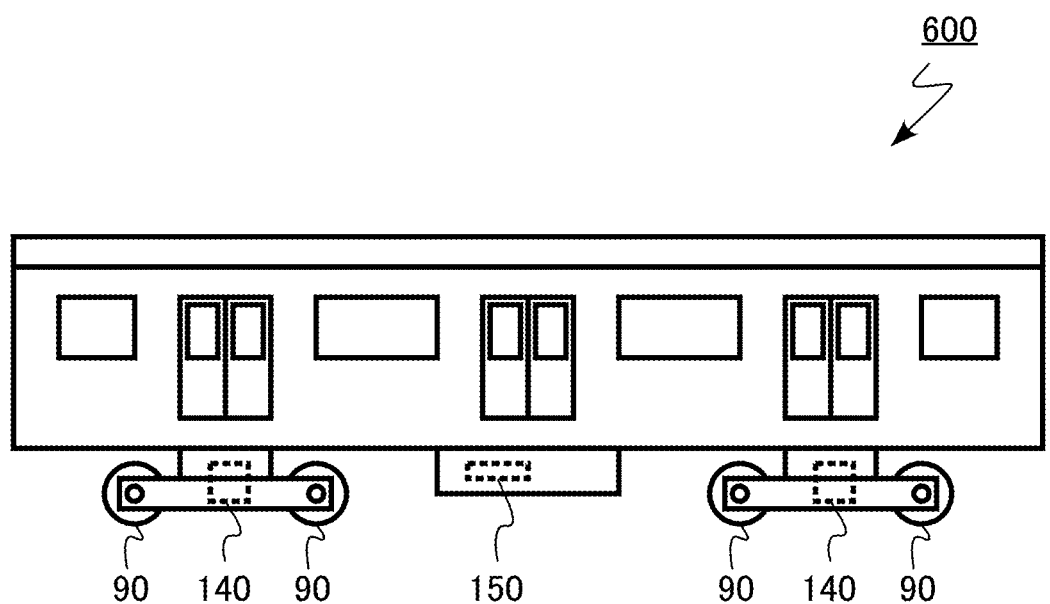
FIG. 23 is a schematic diagram of a vehicle according to a fifth embodiment.

FIG. 23 is a schematic diagram of the vehicle according to the fifth embodiment. A vehicle 600 according to the fifth embodiment is a railway vehicle. The vehicle 900 includes a motor 140 and an inverter circuit 150.

The inverter circuit 150 includes three semiconductor modules using the MOSFET 100 of the first embodiment as a switching element. By connecting the three semiconductor modules in parallel, the three-phase inverter circuit 150 including three AC voltage output terminals U, V, and W is implemented. The motor 140 is driven by the AC voltage output from the inverter circuit 150. Wheels 90 of the vehicle 600 are rotated by the motor 140.

According to the fifth embodiment, characteristics of the vehicle 600 are improved by providing the MOSFET 100 with improved characteristics.

Sixth Embodiment

A vehicle according to a sixth embodiment is a vehicle including the semiconductor device according to the first embodiment.

Figure 24:
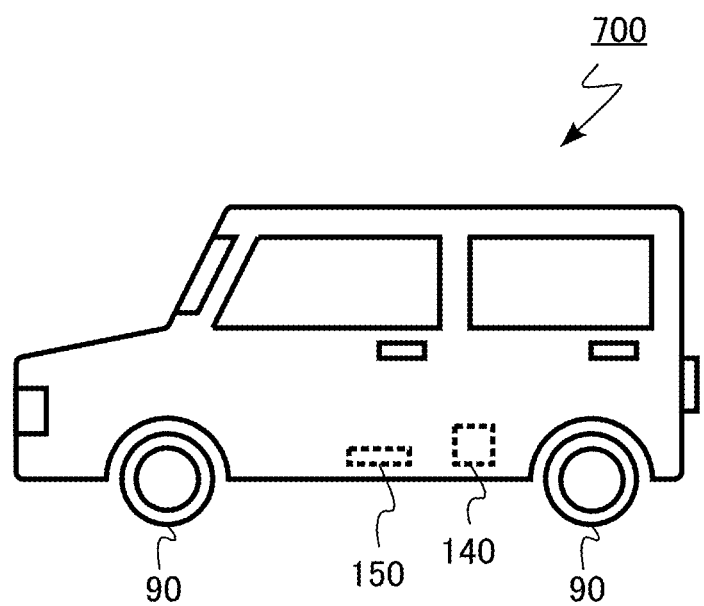
FIG. 24 is a schematic diagram of a vehicle according to a sixth embodiment.

FIG. 24 is a schematic diagram of the vehicle according to the sixth embodiment. A vehicle 700 according to the sixth embodiment is an automobile. The vehicle 700 includes a motor 140 and an inverter circuit 150.

The inverter circuit 150 includes three semiconductor modules using the MOSFET 100 of the first embodiment as a switching element. By connecting the three semiconductor modules in parallel, the three-phase inverter circuit 150 including three AC voltage output terminals U, V, and W is implemented.

The motor 140 is driven by the AC voltage output from the inverter circuit 150. Wheels 90 of the vehicle 700 are rotated by the motor 140.

According to the sixth embodiment, characteristics of the vehicle 700 are improved by providing the MOSFET 100 with improved characteristics.

Seventh Embodiment

An elevator according to a seventh embodiment is an elevator including the semiconductor device according to the first embodiment.

Figure 25:
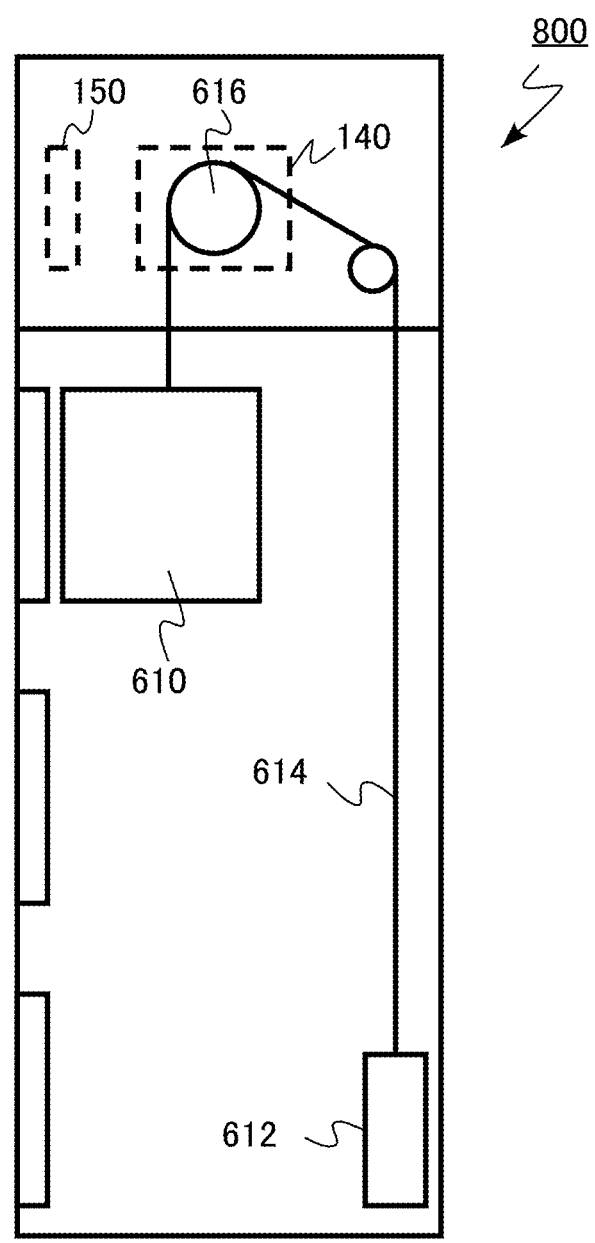
FIG. 25 is a schematic diagram of an elevator according to a seventh embodiment.

FIG. 25 is a schematic diagram of an elevator (lift) according to the seventh embodiment. An elevator 800 according to the seventh embodiment includes a car 610, a counterweight 612, a wire rope 614, a hoisting machine 616, a motor 140, and an inverter circuit 150.

The inverter circuit 150 includes three semiconductor modules using the MOSFET 100 of the first embodiment as a switching element. By connecting the three semiconductor modules in parallel, the three-phase inverter circuit 150 including three AC voltage output terminals U, V, and W is implemented.

The motor 140 is driven by the AC voltage output from the inverter circuit 150. The hoisting machine 616 is rotated by the motor 140, and the car 610 moves upwards and downwards.

According to the seventh embodiment, the characteristics of the elevator 800 are improved by providing the MOSFET 100 with improved characteristics.

In the first to third embodiments, the case of 4H—SiC has been described as an example of the crystal structure of SiC, but the present disclosure can also be applied to devices using SiC having other crystal structures such as 6H—SiC and 3C—SiC. Further, it is also possible to apply a face other than the (0001) face to the surface of the silicon carbide layer 10.

In the first to third embodiments, the case where the gate electrode 18 has a so-called stripe shape has been described as an example, but the shape of the gate electrode 18 is not limited to the stripe shape. For example, the shape of the gate electrode 18 may be a lattice shape.

In the first to third embodiments, aluminum (Al) is exemplified as the p-type impurity, but boron (B) can also be used. In addition, although nitrogen (N) and phosphorus (P) have been exemplified as the n-type impurity, arsenic (As), antimony (Sb), and the like can also be applied.

In the first to third embodiments, the case where the conductor is the bonding wire has been described as an example, but the conductor may be, for example, a clip used for clip bonding.

In the first embodiment, the case where a semiconductor device is a discrete device has been described as an example, but the semiconductor device may be a module device on which a plurality of semiconductor chips are mounted.

The number of the transistor regions 101 and the diode regions 102 and the arrangement of the transistor regions 101 and the diode regions 102 are not limited to those of the first to third embodiments.

In the fourth to seventh embodiments, the configuration including the MOSFET 100 of the first embodiment has been described as an example, but the configuration including the MOSFET of the second or third embodiment is also possible.

In the fourth to seventh embodiments, the case where the semiconductor device of the present disclosure is applied to a vehicle or an elevator has been described as an example, but the semiconductor device of the present disclosure can also be applied to, for example, a power conditioner of a solar power generation system.

While certain embodiments have been described, these embodiments have been presented by way of example only, and are not intended to limit the scope of the inventions. Indeed, the semiconductor device, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor chip including a plurality of transistor regions and at least one diode region,
   wherein the transistor regions include:
   a silicon carbide layer having a first plane and a second plane facing the first plane, the silicon carbide layer including a first silicon carbide region of n-type having a plurality of first portions in contact with the first plane, a second silicon carbide region of p-type provided between the first silicon carbide region and the first plane, and a third silicon carbide region of n-type provided between the second silicon carbide region and the first plane;
   a first electrode in contact with the first portions, the second silicon carbide region, and the third silicon carbide region;
   a second electrode in contact with the second plane;
   a gate electrode facing the second silicon carbide region; and
   a gate insulating layer provided between the gate electrode and the second silicon carbide region,
   wherein the at least one diode region includes:
   the silicon carbide layer including the first silicon carbide region of n-type having a plurality of second portions in contact with the first plane and a fourth silicon carbide region of p-type provided between the first silicon carbide region and the first plane;
   the first electrode in contact with the second portions and the fourth silicon carbide region; and
   the second electrode,
   wherein an occupied area per unit area of the fourth silicon carbide region projected onto the first plane is larger than an occupied area per the unit area of the second silicon carbide region projected onto the first plane,
   wherein a first diode region being one of the at least one diode region is provided between a first transistor region and a second transistor region, the first transistor region is one of the transistor regions, the second transistor region is one of the transistor regions provided in a first direction with respect to the first transistor region, and
   wherein the first transistor region includes a third electrode provided on a side of the first plane of the silicon carbide layer and separated from the first electrode;
   a first conductor having one end in contact with the first electrode and applying a voltage to the first electrode;
   a second conductor having one end in contact with the third electrode and applying a voltage to the third electrode;
   a first metal layer configured to face the second electrode and electrically connected to the second electrode;
   a second metal layer in contact with the other end of the first conductor; and
   a third metal layer in contact with the other end of the second conductor.

2. The semiconductor device according to claim 1, wherein the third electrode is in contact with the first portions, the second silicon carbide region, and the third silicon carbide region.

3. The semiconductor device according to claim 1, wherein a distance between the third electrode and the at least one diode region is 100 μm or less.

4. A semiconductor device comprising:
   a semiconductor chip including a plurality of transistor regions and at least one diode region,
   wherein the transistor regions include:
   a silicon carbide layer having a first plane and a second plane facing the first plane, the silicon carbide layer including a first silicon carbide region of n-type having a plurality of first portions in contact with the first plane, a second silicon carbide region of p-type provided between the first silicon carbide region and the first plane, and a third silicon carbide region of n-type provided between the second silicon carbide region and the first plane;
   a first electrode in contact with the first portions, the second silicon carbide region, and the third silicon carbide region;
   a second electrode in contact with the second plane;
   a gate electrode facing the second silicon carbide region; and
   a gate insulating layer provided between the gate electrode and the second silicon carbide region,
   wherein the at least one diode region includes:
   the silicon carbide layer including the first silicon carbide region of n-type having a plurality of second portions in contact with the first plane and a fourth silicon carbide region of p-type provided between the first silicon carbide region and the first plane;
   the first electrode in contact with the second portions and the fourth silicon carbide region; and
   the second electrode,
   wherein an occupied area per unit area of the fourth silicon carbide region projected onto the first plane is larger than an occupied area per the unit area of the second silicon carbide region projected onto the first plane,
   wherein a first diode region being one of the at least one diode region is provided between a first transistor region and a second transistor region, the first transistor region is one of the transistor regions, the second transistor region is one of the transistor regions provided in a first direction with respect to the first transistor region, and
   wherein the first transistor region includes a third electrode provided on a side of the first plane of the silicon carbide layer and separated from the first electrode;

a first conductor having one end in contact with the first electrode and applying a voltage to the first electrode; and a second conductor having one end in contact with the third electrode and applying a voltage to the third electrode, wherein a distance between the third electrode and the first electrode is 100 µm or less.

5. A semiconductor device comprising:

a semiconductor chip including a plurality of transistor regions and at least one diode region, wherein the transistor regions include:

a silicon carbide layer having a first plane and a second plane facing the first plane, the silicon carbide layer including a first silicon carbide region of n-type having a plurality of first portions in contact with the first plane, a second silicon carbide region of p-type provided between the first silicon carbide region and the first plane, and a third silicon carbide region of n-type provided between the second silicon carbide region and the first plane;

a first electrode in contact with the first portions, the second silicon carbide region, and the third silicon carbide region;

a second electrode in contact with the second plane;

a gate electrode facing the second silicon carbide region; and a gate insulating layer provided between the gate electrode and the second silicon carbide region, wherein the at least one diode region includes:

the silicon carbide layer including the first silicon carbide region of n-type having a plurality of second portions in contact with the first plane and a fourth silicon carbide region of p-type provided between the first silicon carbide region and the first plane;

the first electrode in contact with the second portions and the fourth silicon carbide region; and the second electrode, wherein an occupied area per unit area of the fourth silicon carbide region projected onto the first plane is larger than an occupied area per the unit area of the second silicon carbide region projected onto the first plane, wherein a first diode region being one of the at least one diode region is provided between a first transistor region and a second transistor region, the first transistor region is one of the transistor regions, the second transistor region is one of the transistor regions provided in a first direction with respect to the first transistor region, and wherein the first transistor region includes a third electrode provided on a side of the first plane of the silicon carbide layer and separated from the first electrode;

a first conductor having one end in contact with the first electrode and applying a voltage to the first electrode; and a second conductor having one end in contact with the third electrode and applying a voltage to the third electrode, wherein an area of the third electrode is 10% or less of an area of the first electrode.

6. The semiconductor device according to claim 1, wherein each of the first conductor and the second conductor is a bonding wire.

7. The semiconductor device according to claim 1, wherein a contact area per the unit area between the first electrode and the fourth silicon carbide region is larger than a contact area per the unit area between the first electrode and the second silicon carbide region.

8. The semiconductor device according to claim 1, wherein a second distance between two of the second portions adjacent to each other with the fourth silicon carbide region interposed therebetween is equal to a first distance between two of the first portions adjacent to each other with the second silicon carbide region interposed therebetween.

9. An inverter circuit comprising the semiconductor device according to claim 1.

10. A driving device comprising the semiconductor device according to claim 1.

11. A vehicle comprising the semiconductor device according to claim 1.

12. An elevator comprising the semiconductor device according to claim 1.

* * * * *